US008717260B2

(12) United States Patent
Takagi

(10) Patent No.: US 8,717,260 B2
(45) Date of Patent: May 6, 2014

(54) EL DISPLAY PANEL, EL DISPLAY DEVICE PROVIDED WITH EL DISPLAY PANEL, ORGANIC EL DISPLAY DEVICE, AND METHOD FOR MANUFACTURING EL DISPLAY PANEL

(75) Inventor: Seiji Takagi, Osaka (JP)

(73) Assignee: Panasonic Corporation, Osaka (JP)

( * ) Notice: Subject to any disclaimer, the term of this patent is extended or adjusted under 35 U.S.C. 154(b) by 109 days.

(21) Appl. No.: 13/455,578

(22) Filed: Apr. 25, 2012

(65) Prior Publication Data

US 2012/0206066 A1 Aug. 16, 2012

Related U.S. Application Data

(63) Continuation of application No. PCT/JP2010/003988, filed on Jun. 16, 2010.

(51) Int. Cl.
*G09G 3/30* (2006.01)

(52) U.S. Cl.
USPC .......... 345/76; 345/55; 315/169.3; 315/169.4

(58) Field of Classification Search
USPC .................. 313/495–512; 315/169.3, 169.4; 257/40, 79; 428/690, 917; 345/30, 36, 345/44, 45, 55, 76; 252/72, 181.1, 194; 340/FOR. 281, FOR. 282
See application file for complete search history.

(56) References Cited

U.S. PATENT DOCUMENTS

| 5,443,922 A | 8/1995 | Nishizaki et al. |
| 7,071,619 B2 * | 7/2006 | Iwase et al. ................... 313/512 |
| 2010/0001939 A1 | 1/2010 | Ochiai et al. |

FOREIGN PATENT DOCUMENTS

| JP | 61-41102 | 2/1986 |
| JP | 5-163488 | 6/1993 |
| JP | 6-308319 | 11/1994 |
| JP | 2000-28819 | 1/2000 |
| JP | 2000-111724 | 4/2000 |
| JP | 2000-284111 | 10/2000 |
| JP | 2003-43464 | 2/2003 |
| JP | 2007-280718 | 10/2007 |
| JP | 2008-112001 | 5/2008 |
| JP | 2010-14760 | 1/2010 |

OTHER PUBLICATIONS

International Search Report, mailed Sep. 28, 2012, for parent International Application No. PCT/JP2010/003988.
U.S. Appl. No. 13/447,868 to Seiji Takagi, filed Apr. 16, 2012.

* cited by examiner

*Primary Examiner* — Daniel Cavallari
*Assistant Examiner* — Borna Alaeddini
(74) *Attorney, Agent, or Firm* — Greenblum & Bernstein, P.L.C.

(57) ABSTRACT

An EL display panel 10 including an EL substrate 11 and a CF 12 facing each other and resin 1221 filling space between the EL substrate 11 and the CF 12. A common bank 112 having a greater width than banks between first, second, and third areas in each portion of the CF 12 lies between two portions corresponding to a first pixel and an adjacent second pixel. A portion of a CF layer 113 formed with respect to an outermost area among areas of the first pixel that covers a top surface of a bank closest to the second pixel extends towards the second pixel and overlaps a portion of a CF layer formed with respect to an area adjacent to the first pixel among areas of the second pixel that covers a top surface of a bank closest to the first pixel.

23 Claims, 15 Drawing Sheets

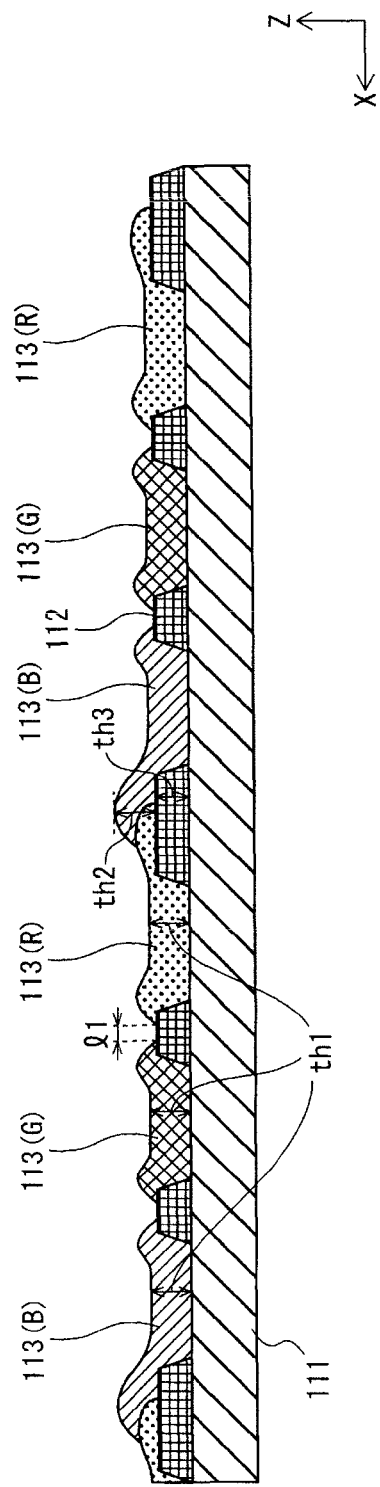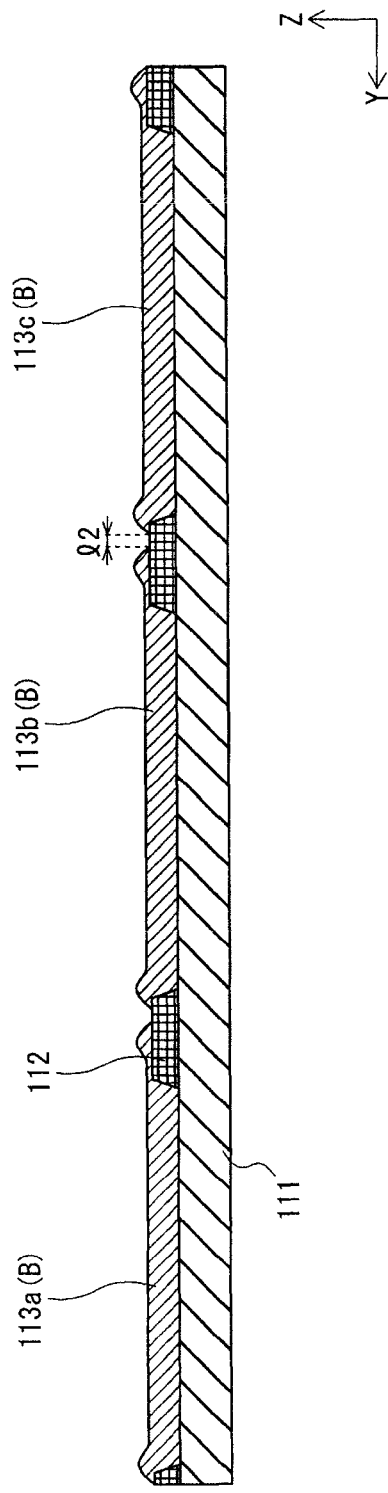
FIG. 4A
FIG. 4B

EL DISPLAY PANEL, EL DISPLAY DEVICE PROVIDED WITH EL DISPLAY PANEL, ORGANIC EL DISPLAY DEVICE, AND METHOD FOR MANUFACTURING EL DISPLAY PANEL

This is a continuation of International Application No. PCT/JP2010/003988, with an international filing date of Jun. 16, 2010.

TECHNICAL FIELD

The present invention relates to an EL display panel, an EL display apparatus provided with an EL display panel, an organic EL display apparatus, and an organic EL display panel manufacturing method, and in particular, to a structure of a color filter in an EL display panel.

DESCRIPTION OF THE RELATED ART

One conventional type of display panel is a liquid crystal display panel (refer to Patent Literature 1, for instance). A liquid crystal display panel is composed of two glass substrates, each of which having predetermined components formed on one surface thereof. The two glass substrates are arranged to face each other and liquid crystal fills the space between the two glass substrates. On a main surface of one glass substrate (a surface facing the other glass substrate), black matrices (hereinafter referred to as "BMs") and color filter (hereinafter referred to as a "CF") layers are formed as the predetermined components (in the following, a glass substrate having BMs and CF layers formed thereon is referred to as a "color filter (CF)"). Each of the color filter layers respectively correspond to the colors R, G, and B. The following provides an explanation of one example of a positional relationship between the BMs and the CF layers formed on a glass substrate. On a glass substrate, CF layers respectively corresponding to the colors R, G, and B are formed in a matrix, and a BM is formed between adjacent CF layers. Each of the CF layers is formed to have a shape defined by the BMs defining a specific CF layer, and further, portions of the CF layer extend over and cover edge portions of the top surfaces of the BMs defining the CF layer.

In the meantime, much progress is currently being made in the research and development of EL display panels, which are considered as being the display panel of the next generation. An EL display panel is composed of a CF and an EL substrate which are arranged facing each other, and further, sealing resin fills the space between the EL substrate and the CF. On one surface of the EL substrate, pixels are arranged in a matrix. Each pixel is composed of a set of light-emitting units respectively corresponding to the colors R, G, and B.

CITATION LIST

Patent Literature

[Patent Literature 1]
Japanese Patent Application Publication No. 2008-112001

SUMMARY OF INVENTION

Technical Problem

As mentioned above, liquid crystal fills the space between the two glass substrates in a liquid crystal display panel. On the other hand, resin fills the space between the CF and the EL substrate in an EL display panel. Concerning this point, the inventor of the present invention has found that "resin-unfilled portions" exist in EL display panels. Here, a "resin-unfilled portion" refers to a portion of the EL display panel which is not appropriately filled with resin. It is particularly problematic when resin-unfilled portions exist in areas of the EL display panel corresponding to light-emitting layers of the light-emitting units. This is since degradation of the light-emitting layers included in the light-emitting units is brought about when oxygen and/or moisture accumulates in the resin-unfilled portions and the oxygen and/or moisture so accumulated reacts with the light-emitting layers. Furthermore, as a result of the degradation of the light-emitting layers, problems arise such as a decrease of the luminance of light emitted from the light-emitting layers and a shortened life-span of the light-emitting layers. In addition to such problems, the difference in refractive indices between the resin-unfilled portions and portions filled with resin in an EL display panel may induce undesired reflection of light, thereby impairing light extraction efficiency of the EL display panel.

In an attempt to overcome the problem of the resin-unfilled portions formed in an EL display panel, the inventor of the present invention conducted an experiment of applying two to three times more resin than theoretically required to fill the space between the CF and the EL substrate. However, no improvement was observed through this experiment.

When taking into account the outcome of the above-described experiment, it may be considered to apply an even greater amount of resin to suppress the forming of resin-unfilled portions. However, such a measure is inappropriate, since it can be easily assumed that a further increase in the amount of resin applied between the EL substrate and the CF will result in difficulty in maintaining a uniform in interval between the EL substrate and the CF.

In view of such problems, one aim of the present invention is to provide an EL display panel in which the existence of resin-unfilled portions at areas corresponding to the light-emitting layers is suppressed compared with conventional El display panels, while not increasing the amount of resin applied to fill the space between the EL substrate and the CF in manufacturing the EL display panel.

Solution to Problem

So as to solve the above-presented problems, the present invention provides an EL display panel comprising: an EL substrate having pixels arranged in a matrix, the pixels each including a first light-emitting unit that emits red light, a second light-emitting unit that emits green light, and a third light-emitting unit that emits blue light; a color filter base facing a light-emitting side of the EL substrate; color filter banks disposed on a surface of the color filter base facing the EL substrate, the color filter banks partitioning the surface of the color filter base into portions respectively corresponding to the pixels of the EL substrate and further partitioning each of the portions of the color filter base into a first area, a second area, and a third area that respectively correspond to the first light-emitting unit, the second light-emitting unit, and the third light-emitting unit; a first color filter layer having a concave shape and defined by (i) top surfaces of a pair of color filter banks defining the first area, (ii) opposing lateral surfaces of the pair of color filter banks defining the first area, and (iii) the first area, the first color filter layer transmitting red light; a second color filter layer having a concave shape and defined by (i) top surfaces of a pair of color filter banks defining the second area, (ii) opposing lateral surfaces of the pair of color filter banks defining the second area, and (iii) the second area, the second color filter layer transmitting green light; a third color filter layer having a concave shape and defined by (i) top surfaces of a pair of color filter banks defining the third area, (ii) opposing lateral surfaces of the pair of color filter banks defining the third area, and (iii) the third area, the third color filter layer transmitting blue light; and a resin layer filling space between each of the pixels of the EL substrate and the corresponding color filter layers formed in the corresponding portion of the color filter base, wherein a common color filter bank between two portions of the color filter base corresponding to a first pixel and a second pixel that are adjacent to each other has a greater width than color filter banks between the first, second, and third areas in each of the portions of the color filter base, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel, and the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, overlap each other above the common color filter bank.

Advantageous Effects of the Invention

The inventor of the present invention focused on the shape of the CF in EL display panels, and has arrived at the conception that the shape of the CF is the cause of generation of the resin-unfilled portions. In a conventional EL display panel, each of the CF layers of the CF has a concavoconvex form, due to a difference in level existing between CF layers and banks defining the CF layers. This difference in level results from the CF layers being formed such that portions of a CF layer extends over and covers edge portions of the top surfaces of the banks defining the CF layer. In specific, the top surface of each of the banks is lower in level compared with the top surface of each of the CF layers. Thus, when the CF is seen as a whole, the CF layers form convexities while the intervals between portions of adjacent CF layers formed above the top surfaces of the banks form concaves.

In addition, an auxiliary electrode is disposed with respect to each of the pixels of an EL substrate of an EL display panel. Such auxiliary electrodes supply electricity to a cathode, and are provided for the purpose of reducing the unevenness in luminance resulting from voltage drop occurring in the cathode. Accordingly, in the CF of an EL display panel, banks having comparatively great widths are formed in areas (hereinafter referred to as "inter-pixel areas") corresponding to the areas between pixels of the EL substrate where auxiliary electrodes are formed, whereas banks having comparatively smaller widths are formed in areas (hereinafter referred to as "inter-subpixel areas") corresponding to the areas between subpixels of the EL substrate. Due to this, the concaves formed above the top surfaces of the banks in the inter-pixel areas have greater widths compared to the concaves formed above the top surfaces of the banks formed in the inter-subpixel areas.

As such, the inventor of the present invention has reached the conception that resin-unfilled portions are formed in EL display panels due to the CF having such a concavoconvex form as described in the above. More specifically, the inventor has observed that, when drops of resin are applied to the CF, resin first spreads so as to cover the concaves having comparatively great widths formed above the banks formed in the inter-pixel areas. Due to this, resin cannot spread in an appropriate manner so as to cover the top surfaces of the CF layers. In consequence, resin-unfilled portions, where resin does not fill the areas corresponding to the light-emitting layers, remain when the EL substrate and the CF are adhered to each other.

In the EL display panel, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel.

Hence, in the EL display panel, the width of a CF bank lying between two adjacent portions of the color filter base corresponding to the first pixel and the second pixel (hereinafter referred to as an "inter-pixel bank") is greater than the widths of CF banks lying between the first, second, and third areas in each of the portions of the color filter base corresponding to a pixel (hereinafter referred to as "inter-subpixel banks"). However, at the same time, a concave having a comparatively great width, which forms a path over which resin spreads, is not formed above the inter-pixel bank.

In fact, since adjacent CF layers overlap each other above the inter-pixel banks, a convexity is formed above each of the inter-pixel banks when the CF is seen as a whole. On the other hand, when viewed in relation to such a convexity, the CF layers, corresponding to the colors R, G, and B, formed within a portion of the color filter base corresponding to one pixel collectively form a concave when the CF is seen as a whole.

That is, the CF layers, corresponding to the colors R, G, and B, within a portion corresponding to a pixel collectively form a concave, which forms a path over which resin spreads. Hence, resin applied to the CF is suppressed from spreading over the convexities formed above the inter-pixel banks, whereas the spread of resin over the concaves formed by top surfaces of the CF layers is promoted.

Accordingly, since the spread of resin over the top surface of each of the CF layers is promoted, the forming of resin-unfilled portions at areas corresponding to the light-emitting layers in the EL display panel, which is yielded by adhering the EL substrate and the CF together, is suppressed.

In addition, in the EL display panel, the convexities above the inter-pixel banks are formed not by using a separate material for the specific purpose, but by using and extending the CF layers, which are conventionally included in an EL display panel. Hence, the forming of resin-unfilled portions is suppressed by applying a simple structure.

BRIEF DESCRIPTION OF DRAWINGS

FIG. 4A is a partial cross-sectional view (taken along line A-A' in FIG. 3B) illustrating a structure of a CF of embodiment 1, and FIG. 4B is a partial cross-sectional view (taken along line B-B' in FIG. 3B) illustrating the structure of the CF of embodiment 1.

DESCRIPTION OF EMBODIMENTS

Aspects of the Invention

Figure 1:
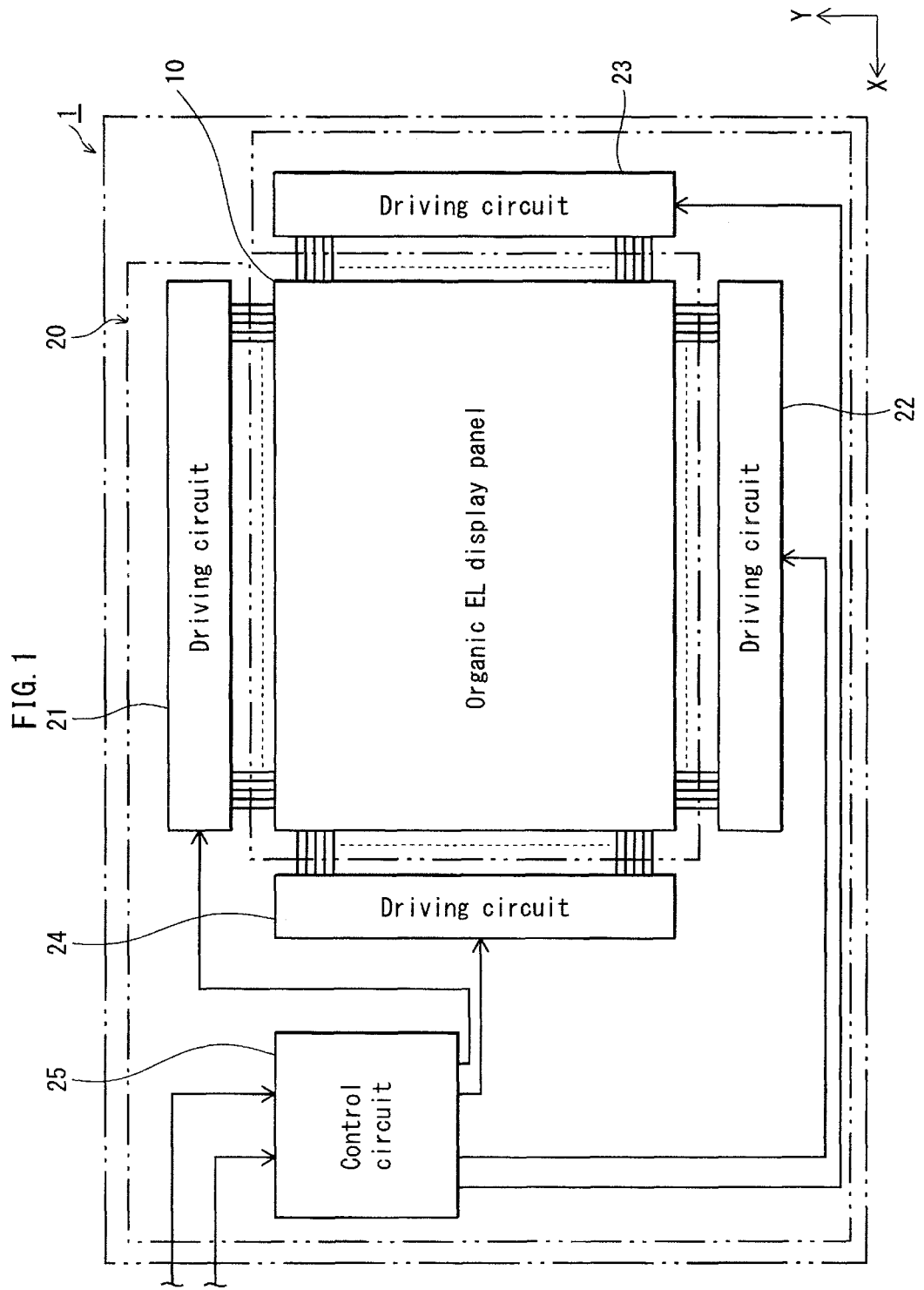
FIG. 1 is a schematic block diagram illustrating an overall structure of a display apparatus 1 of embodiment 1.

One aspect of the present invention is an EL display panel comprising: an EL substrate having pixels arranged in a matrix, the pixels each including a first light-emitting unit that emits red light, a second light-emitting unit that emits green light, and a third light-emitting unit that emits blue light; a color filter base facing a light-emitting side of the EL substrate; color filter banks disposed on a surface of the color filter base facing the EL substrate, the color filter banks partitioning the surface of the color filter base into portions respectively corresponding to the pixels of the EL substrate and further partitioning each of the portions of the color filter base into a first area, a second area, and a third area that respectively correspond to the first light-emitting unit, the second light-emitting unit, and the third light-emitting unit; a first color filter layer having a concave shape and defined by (i) top surfaces of a pair of color filter banks defining the first area, (ii) opposing lateral surfaces of the pair of color filter banks defining the first area, and (iii) the first area, the first color filter layer transmitting red light; a second color filter layer having a concave shape and defined by (i) top surfaces of a pair of color filter banks defining the second area, (ii) opposing lateral surfaces of the pair of color filter banks defining the second area, and (iii) the second area, the second color filter layer transmitting green light; a third color filter layer having a concave shape and defined by (i) top surfaces of a pair of color filter banks defining the third area, (ii) opposing lateral surfaces of the pair of color filter banks defining the third area, and (iii) the third area, the third color filter layer transmitting blue light; and a resin layer filling space between each of the pixels of the EL substrate and the corresponding color filter layers formed in the corresponding portion of the color filter base, wherein a common color filter bank between two portions of the color filter base corresponding to a first pixel and a second pixel that are adjacent to each other has a greater width than color filter banks between the first, second, and third areas in each of the portions of the color filter base, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel, and the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, overlap each other above the common color filter bank.

In the EL display panel, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel.

Hence, in the EL display panel, the width of a CF bank lying between two adjacent portions of the color filter base corresponding to the first pixel and the second pixel is greater than the widths of the CF banks lying between the first, second, and third areas in each of the portions of the color filter base corresponding to a pixel. However, at the same time, a concave having a comparatively great width, which forms a path over which resin spreads, is not formed above each of the inter-pixel banks.

In fact, since adjacent CF layers overlap each other above each of the inter-pixel banks, a convexity is formed above each of the inter-pixel banks when the CF is seen as a whole. On the other hand, when viewed in relation to such a convexity, the CF layers, corresponding to the colors R, G, and B, formed within a portion of the color filter base corresponding to one pixel collectively form a concave when the CF is seen as a whole.

That is, the CF layers, corresponding to the colors R, G, and B, within a portion corresponding to a pixel collectively form a concave, which forms a path over which resin spreads. Hence, resin applied to the CF is suppressed from spreading over the convexities formed above the inter-pixel banks, whereas the spread of resin over the concaves formed by top surfaces of the CF layers is promoted.

Accordingly, since the spread of resin over the top surface of each of the CF layers is promoted, the forming of resin-unfilled portions at areas corresponding to the light-emitting layers in the EL display panel, which is yielded by adhering the EL substrate and the CF together, is suppressed.

In addition, in the EL display panel, the convexities above the inter-pixel banks are formed not by using a separate material for the specific purpose, but by using and extending the CF layers, which are conventionally included in an EL display panel. Hence, the forming of resin-unfilled portions is suppressed by applying a simple structure.

In the El display panel, the portion of the color filter layer fainted with respect to the area adjacent to the first pixel that covers the top surface of the color filter bank closest to the first pixel, among the pair of color filter banks defining the area adjacent to the first pixel, may extend towards the first pixel.

In the EL display panel, the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, may overlap each other at a central region of a top surface of the common filter bank.

In the El display panel, outermost portions of adjacent CF layers overlap each other at a central region of the top surface of the common color filter bank lying between two adjacent portions of the color filter base corresponding to the first pixel and the second pixel.

Hence, an even spread of resin over the adjacent portions corresponding to the first pixel and the second pixel is promoted, which further results in a suppression of the difference in the degree at which each of the two adjacent portions is filled with resin. In addition, since resin spreads evenly over each of the adjacent portions of the color filter base, the forming of resin-unfilled portions is suppressed in each of the portions.

In the EL display panel, portions of color filter layers formed with respect to the first, second, and third areas corresponding to the first pixel that cover top surfaces of color filter banks closest to a third pixel adjacent to the first pixel in a direction intersecting a direction along which the first and second pixels are adjacent (i) may extend towards the third pixel and (ii) may have greater lengths than portions of the color filter layers formed with respect to the first, second, and third areas corresponding to the first pixel that cover top surfaces of color filter banks opposing the color filter banks closest to the third pixel.

In the EL display panel, portions of CF layers formed with respect to the first, second, and third areas corresponding to the first pixel that cover top surfaces of color filter banks closest to a third pixel extend towards the third pixel. As such, reduced intervals exist between (i) portions of CF layers formed with respect to the first, second, and third areas corresponding to the first pixel that cover top surfaces of color filter banks closest to a third pixel and (ii) the portions of the color filter layers formed with respect to the first, second, and third areas corresponding to the third pixel that cover top surfaces of color filter banks opposing color filter banks closest to the first pixel.

This structure reduces the widths of the concaves, each of which forms a path over which the resin spreads. Hence, the resin applied to the CF is suppressed from spreading over the intervals above the inter-pixel banks, whereas the spread of resin over the top surfaces of the CF layers is promoted.

By forming the CF layers such that outermost portions of adjacent CF layers overlap each other above the CF bank lying between two adjacent portions of the color filter base corresponding to the first pixel and the second pixel, and in addition, by extending the CF layers formed with respect to the first, second, and third areas corresponding to the first pixel towards the third pixel, the unevenness in the spread of resin is suppressed to a greater extent. Hence, the forming of resin-unfilled portions in the EL display panel is suppressed to a greater extent.

Another aspect of the present invention is an EL display panel comprising: an EL substrate having pixels arranged in a matrix, the pixels each including a first light-emitting unit that emits red light, a second light-emitting unit that emits green light, and a third light-emitting unit that emits blue light; a color filter base facing a light-emitting side of the EL substrate; a first color filter layer that transmits red light and that is formed with respect to a first area on a surface of the color filter base, the first area corresponding to the first light-emitting element; a second color filter layer that transmits green light and that is formed with respect to a second area on the surface of the color filter base, the second area corresponding to the second light-emitting element and being located at a predetermined interval from the first color filter layer; a third color filter layer that transmits blue light and that is formed with respect to a third area on the surface of the color filter base, the third area corresponding to the third light-emitting element and being located at an interval from the second color filter layer, the interval equaling or falling within a predetermined range of approximation to the predetermined interval; and a resin layer filling space between each of the pixels of the EL substrate and the corresponding color filter layers formed in a corresponding one of portions of the surface of the color filter base, the portions of the surface of the color filter base respectively corresponding to the pixels of the EL substrate, wherein a color filter layer formed with respect to an outermost area, among the first, second, and third areas corresponding to a first pixel, extends towards a second pixel that is adjacent to the first pixel, and an end portion, closest to the second pixel, of the color filter layer formed with respect to the outermost area, among the first, second, and third areas corresponding to the first pixel, and an end portion, closest to the first pixel, of a color filter layer formed with respect to an area adjacent to the first pixel, among the first, second, and third areas corresponding to the second pixel, overlap each other in between the first pixel and the second pixel.

In the EL display panel, a color filter layer formed with respect to an outermost area, among the first, second, and third areas corresponding to a first pixel, extends towards a second pixel that is adjacent to the first pixel, and an end portion, closest to the second pixel, of the color filter layer formed with respect to the outermost area, among the first, second, and third areas corresponding to the first pixel, and an end portion, closest to the first pixel, of a color filter layer formed with respect to an area adjacent to the first pixel, among the first, second, and third areas corresponding to the second pixel, overlap each other.

Due to this, in the EL display panel, a concave, which forms a path over which resin spreads, is not formed at an area (hereinafter referred to as an "inter-pixel area") of the CF corresponding to in between the first pixel and the second pixel. In fact, a convexity is formed above each of the inter-pixel regions when the CF is seen as a whole.

On the other hand, when viewed in relation to such a convexity, the CF layers, corresponding to the colors R, G, and B, within a portion of the color filter base corresponding to one pixel collectively form a concave when the CF is seen as a whole.

That is, the CF layers, corresponding to the colors R, G, and B, within a portion corresponding to a pixel form a concave, which forms a path over which resin spreads. Hence, resin applied to the CF is suppressed from spreading over the convexities formed above the inter-pixel regions, whereas the spread of resin over the concaves formed by top surfaces of the CF layers is promoted.

Accordingly, since the spread of resin over the top surface of each of the CF layers is promoted, the forming of resin-unfilled portions at areas corresponding to the light-emitting layers in the EL display panel, which is yielded by adhering the EL substrate and the CF together, is suppressed.

In addition, in the EL display panel, the convexities above the inter-pixel banks are formed not by using a separate material for the specific purpose, but by using and extending the CF layers, which are conventionally included in an EL display panel. Hence, the forming of resin-unfilled portions is suppressed by applying a simple structure.

As such, the reduction of resin-unfilled portions at areas of the CF corresponding to the light-emitting layers of the EL substrate is realized even when the EL display panel incorporates a CF that is not provided with color filter banks.

In the EL display panel, the color filter layer formed with respect to the area adjacent to the first pixel, among the first, second, and third areas corresponding to the second pixel, may extend towards the first pixel In the EL display panel, the end portion, closest to the second pixel, of the color filter layer formed with respect to the outermost area, among the first, second, and third areas corresponding to the first pixel, and the end portion, closest to the first pixel, of the color filter layer formed with respect to the area adjacent to the first pixel, among the first, second, and third areas corresponding to the second pixel, may overlap each other at a central region in between the first pixel and the second pixel.

In the El display panel, outermost portions of adjacent CF layers overlap each other above a central region of an inter-pixel area.

Hence, an even spread of resin over the adjacent portions corresponding to the first pixel and the second pixel is promoted, which further results in a suppression of the difference in the degree at which each of the two adjacent portions is filled with resin. In addition, since resin spreads evenly over each of the portions, the forming of resin-unfilled portions is suppressed in each of the portions.

In the El display panel, color filter layers respectively formed with respect to the first, second, and third areas corresponding to the first pixel may extend towards a third pixel adjacent to the first pixel in a direction intersecting a direction along which the first and second pixels are adjacent.

In the EL display panel, the CF layers formed with respect to the first, second, and third areas corresponding to the first pixel extend towards the third pixel. As such, reduced intervals exist between (i) CF layers formed with respect to the first, second, and third areas corresponding to the first pixel and (ii) the CF layers formed with respect to the first, second, and third areas corresponding to the third pixel.

This structure reduces the widths of the concaves, each of which forms a path over which the resin spreads. Hence, the resin applied to the CF is suppressed from spreading over an inter-pixel area of the CF which corresponds to in between the first pixel and the third pixel, whereas the spread of resin over the top surface of each of the CF layers is promoted.

By forming the CF layers such that outermost portions of adjacent CF layers overlap each other above an inter-pixel area of the CF which corresponds to in between the first pixel and the second pixel, and in addition, by extending the CF layers formed with respect to the first, second, and third areas corresponding to the first pixel towards the third pixel, the unevenness in the spread of resin is suppressed to a greater extent. Hence, the forming of resin-unfilled portions in the EL display panel is suppressed to a greater extent.

One aspect of the present invention is an EL display apparatus comprising: the EL display panel described above.

In the EL display apparatus, the forming of resin-unfilled portions at areas corresponding to the light-emitting layers is suppressed for the same reasons set forth above.

In the EL display panel, each of the first light-emitting unit, the second light-emitting unit, and the third light-emitting unit may be an organic light emitter.

In the EL display panel, since each of the first light-emitting unit, the second light-emitting unit, and the third light-emitting unit is an organic light emitter, an organic EL display panel is realized.

One aspect of the present invention is an organic EL display apparatus comprising: the EL display panel described above.

In the EL display apparatus, the forming of resin-unfilled portions at areas corresponding to the light-emitting layers is suppressed for the same reasons set forth above.

Another aspect of the present invention is a manufacturing method for an EL display panel, the manufacturing method comprising: a first step of preparing an EL substrate having pixels arranged in a matrix, the pixels each including a first light-emitting unit that emits red light, a second light-emitting unit that emits green light, and a third light-emitting unit that emits blue light; a second step of preparing a color filter base; a third step of forming color filter banks on a surface of the color filter base that is to face the EL substrate, the color filter banks partitioning the surface of the color filter base into portions respectively corresponding to the pixels of the EL substrate and further partitioning each of the portions of the color filter base into a first area, a second area, and a third area that respectively correspond to the first light-emitting unit, the second light-emitting unit, and the third light-emitting unit; a fourth step of forming a first color filter layer having a concave shape and defined by (i) top surfaces of a pair of color filter banks defining the first area, (ii) opposing lateral surfaces of the pair of color filter banks defining the first area, and (iii) the first area, the first color filter layer transmitting red light; a fifth step of forming a second color filter layer having a concave shape and defined by (i) top surfaces of a pair of color filter banks defining the second area, (ii) opposing lateral surfaces of the pair of color filter banks defining the second area, and (iii) the second area, the second color filter layer transmitting green light; a sixth step of forming a third color filter layer having a concave shape and defined by (i) top surfaces of a pair of color filter banks defining the third area, (ii) opposing lateral surfaces of the pair of color filter banks defining the third area, and (iii) the third area, the third color filter layer transmitting blue light; and a seventh step of filling space between each of the pixels of the EL substrate and the corresponding color filter layers formed in the corresponding portion of the color filter base with use of resin material, wherein a common color filter bank between two portions of the color filter base corresponding to a first pixel and a second pixel that are adjacent to each other has a greater width than color filter banks between the first, second, and third areas in each of the portions of the color filter base, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel, and the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, overlap each other above the common color filter bank.

In the manufacturing method, the portion of the color filter layer formed with respect to the area adjacent to the first pixel that covers the top surface of the color filter bank closest to the first pixel, among the pair of color filter banks defining the area adjacent to the first pixel, may extend towards the first pixel.

In the manufacturing method, the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, may overlap each other at a central region of a top surface of the common filter bank.

In the manufacturing method, portions of color filter layers formed with respect to the first, second, and third areas corresponding to the first pixel that cover top surfaces of color filter banks closest to a third pixel adjacent to the first pixel in a direction intersecting a direction along which the first and second pixels are adjacent (i) may extend towards the third pixel and (ii) may have greater lengths than portions of the color filter layers formed with respect to the first, second, and third areas corresponding to the first pixel that cover top surfaces of color filter banks opposing the color filter banks closest to the third pixel.

Another aspect of the present invention is a manufacturing method for an EL display panel, the manufacturing method comprising: a first step of preparing an EL substrate having pixels arranged in a matrix, the pixels each including a first light-emitting unit that emits red light, a second light-emitting unit that emits green light, and a third light-emitting unit that emits blue light; a second step of preparing a color filter base; a third step of forming a first color filter layer that transmits red light with respect to a first area on a surface of the color filter base, the first area corresponding to the first light-emitting element; a fourth step of forming a second color filter layer that transmits green light with respect to a second area on the surface of the color filter base, the second area corresponding to the second light-emitting element and being located at a predetermined interval from the first color filter layer; a fifth step of forming a third color filter layer that transmits blue light with respect to a third area on the surface of the color filter base, the third area corresponding to the third light-emitting element and being located at an interval from the second color filter layer, the interval equaling or falling within a predetermined range of approximation to the predetermined interval; and a sixth step of filling space between each of the pixels of the EL substrate and the corresponding color filter layers formed in a corresponding one of portions of the surface of the color filter base with use of resin material, the portions of the surface of the color filter base respectively corresponding to the pixels of the EL substrate, wherein a color filter layer formed with respect to an outermost area, among the first, second, and third areas corresponding to a first pixel, extends towards a second pixel that is adjacent to the first pixel, and an end portion, closest to the second pixel, of the color filter layer formed with respect to the outermost area, among the first, second, and third areas corresponding to the first pixel, and an end portion, closest to the first pixel, of a color filter layer formed with respect to an area adjacent to the first pixel, among the first, second, and third areas corresponding to the second pixel, overlap each other in between the first pixel and the second pixel.

In the manufacturing method, the color filter layer formed with respect to the area that is adjacent to the first pixel, among the first, second, and third areas corresponding to the second pixel, may extend towards the first pixel.

In the manufacturing method, the end portion, closest to the second pixel, of the color filter layer formed with respect to the outermost area, among the first, second, and third areas corresponding to the first pixel, and the end portion, closest to the first pixel, of the color filter layer formed with respect to the area adjacent to the first pixel, among the first, second, and third areas corresponding to the second pixel, may overlap each other at a central region in between the first pixel and the second pixel.

In the manufacturing method, color filter layers respectively formed with respect to the first, second, and third areas corresponding to the first pixel may extend towards a third pixel adjacent to the first pixel in a direction intersecting a direction along which the first and second pixels are adjacent.

Embodiment 1

<Overall Structure of Display Apparatus 1>

Description is provided in the following concerning an overall structure of a display apparatus 1 pertaining to the present embodiment, with reference to the accompanying FIG. 1. FIG. 1 is a schematic block diagram illustrating the overall structure of the display apparatus 1.

As illustrated in FIG. 1, the display apparatus 1 includes an organic EL display panel 10 and a drive control unit 20 that is connected with the organic EL display panel 10. The organic EL display panel 10 is a top emission type organic EL display panel, which utilizes the phenomenon of electroluminescence occurring in organic material.

The drive control unit 20 includes four driving circuits, namely driving circuits 21-24, and a control circuit 25.

Here, note that the location at which the drive control unit 20 is arranged with respect to the organic EL display panel 10 is not limited to the location illustrated in FIG. 1 when actually implementing the display apparatus 1.

<Structure of the Organic EL Display Panel>

(Overall Structure of the Organic EL Display Panel)

Figure 2:
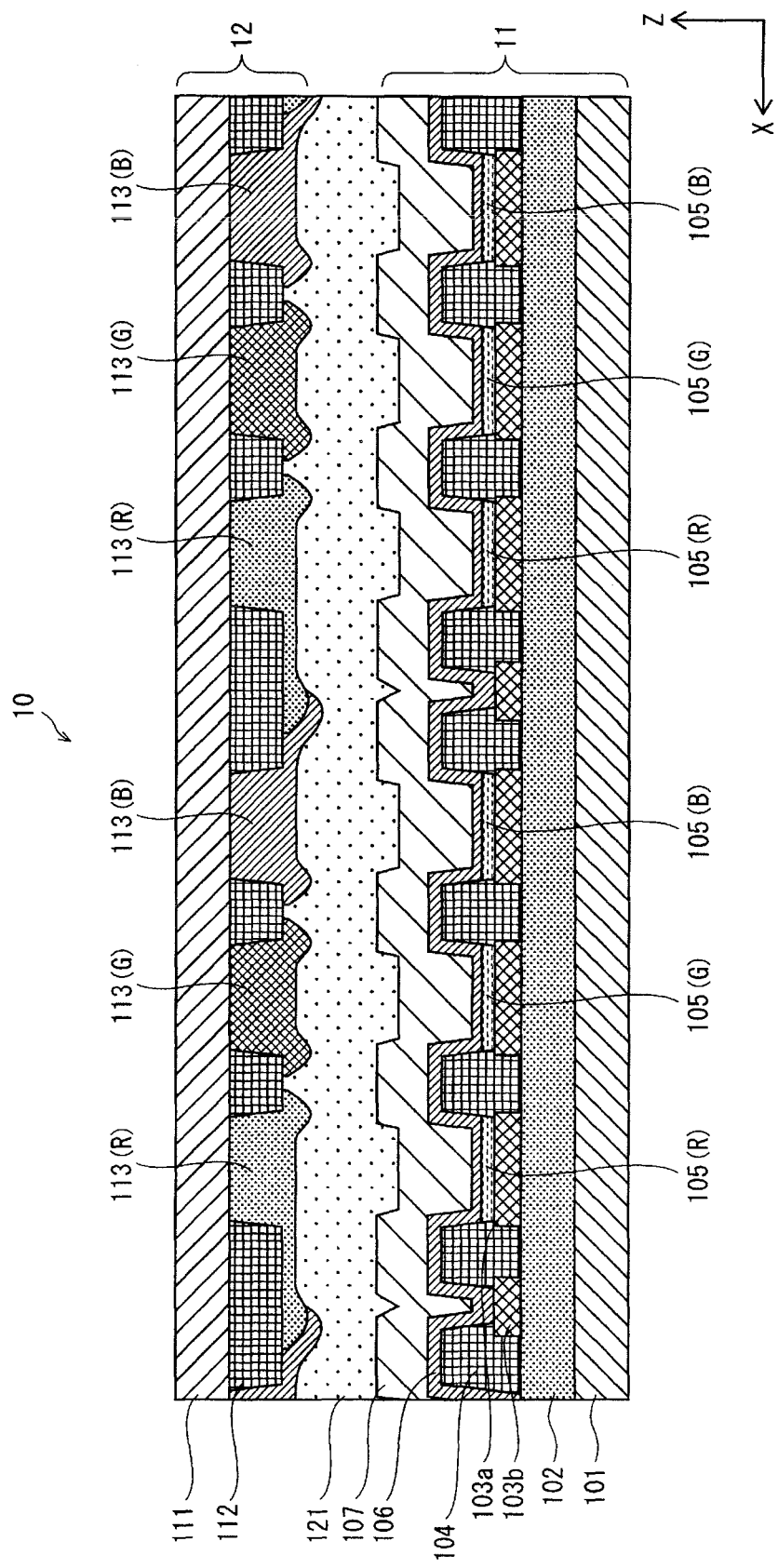
FIG. 2 is a partial schematic cross-sectional view illustrating a main part of an organic EL display panel 10 of embodiment 1.

In the following, detailed explanation is provided of the structure of the organic EL display panel 10. FIG. 2 is a partial schematic cross-sectional view illustrating a main part of the organic EL display panel of embodiment 1. As illustrated in FIG. 2, the organic EL display panel 10 of embodiment 1 has a structure where an interlayer insulating film 102 is formed on a TFT substrate 101, and anodes 103a are formed on the interlayer insulting film 102 in a matrix by patterning. More specifically, an anode 103a is formed for each sub-pixel unit.

Further, a set of three sub-pixels adjacent in the X-axis direction constitutes a single pixel of the organic EL display panel 10, and auxiliary electrodes 103b are disposed so as to form lines on the interlayer insulating film 102.

Banks 104 are formed (i) between adjacent anodes 103a and (ii) between an anode 103a and an auxiliary electrode 103b that are adjacent to each other. Above each of the anodes 103a and within an area defined by a pair of banks 104, an organic light-emitting layer 105 of a predetermined color is laminated. Further, above the organic light-emitting layers 105, a cathode 106 and a sealing layer 107 are fowled. More specifically, the cathode 106 and the sealing layer 107 are each formed so as to extend over the areas defined by the pairs of the banks 104 and so as to be continuous (i) between adjacent organic light-emitting layers 105 and (ii) between an organic light-emitting layer 105 and an auxiliary electrode 103b that are adjacent to each other.

The combination of such components (102-107) as described up to this point is referred to as an EL substrate 11 in the following.

In addition, on one side (a side facing the EL substrate 11) of a substrate main body 111 of a color filter (hereinafter referred to as a "CF"), black matrices (hereinafter referred to as "BMs") 112 and CF layers 113 are disposed. The CF layers 113 each correspond to one of the colors R, G, and B.

The combination of such components (111-113) as described up to this point is referred to as a CF 12 in the following.

In the following, explanation is provided of a positional relationship between (i) the auxiliary electrodes 103b, (ii) the banks 104, (iii) the organic light emitting layers 105 (R), 105 (G), and 105 (B), (iv) the BMs 112 and (v) the CFs 113 (R), 113 (G), and 113(B). As illustrated in FIG. 2, the BMs 112 are formed at areas of the CF 12 corresponding to the auxiliary electrodes 103b and the banks 104 of the EL substrate 11. In addition, at areas of the CF 12 corresponding to the organic light emitting layers 105 (R), 105 (G), and 105 (B) of the EL substrate 11, the CF layers 113 (R), 113 (G), and 113 (B) of the corresponding colors are respectively formed.

Further, the auxiliary electrodes 103b are formed at inter-pixel areas of the EL substrate 11. Thus, among the BMs 112 of the CF 12, BMs 112 corresponding to inter-pixel areas of the EL substrate 11 (hereinafter referred to as "inter-pixel BMs") have greater widths than BMs 112 corresponding to inter-subpixel areas of the EL substrate 11 (hereinafter referred to as "inter-subpixel BMs").

Further, a resin sealing layer 121 fills space between the EL substrate 11 and the CF 12.

(Structure of the CF 12)

—Locations where the BMs 112 are Arranged—

Figure 3A:
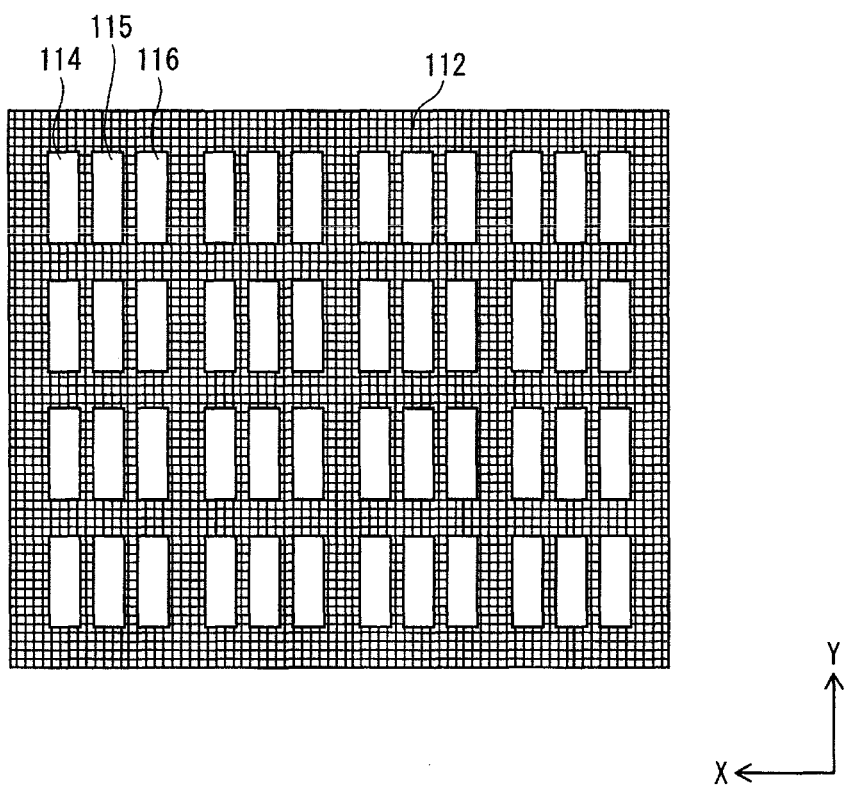
FIG. 3A is a schematic diagram illustrating a structure of BMs of embodiment 1 and FIG. 3B is a schematic diagram illustrating a positional relationship between the BMs and CF layers of embodiment 1.

Subsequently, detailed explanation is provided of a structure of the CF 12. FIG. 3A is a schematic diagram illustrating locations where the BMs 112 are arranged. In FIG. 3A, the outlined portions (illustrated as white boxes) indicate areas where the BMs 112 are not formed. A set of three outlined portions adjacent in the X-axis direction (composed of a first area 114, a second area 115, and a third area 116) constitute one unit, and a plurality of such units are formed in a matrix as illustrated in FIG. 3A. In other words, the BMs 112 are formed so as to partition the CF 12 into such units, and further, to partition each of such units into the first area 114, the second area 115, and the third area 116. Here, note that the first area 114, the second area 115, and the third area 116 are disposed in a matrix.

On the CF 12, the BMs 112 having greater widths compared with the other BMs 112 in the X-axis direction are the inter-pixel BMs. More specifically, the inter-pixel BMs 112 having greater widths each correspond to one auxiliary electrode 103b of the EL substrate 11 and thus, is formed with respect to each pixel of the EL substrate 11.

In addition, on the EL substrate 11, contact holes are formed at edge portions of the anodes 103a in the Y-axis direction. Emission of light is regulated at areas of the anodes 103a in the periphery of the contact holes. Hence, the BMs 112 are also formed at areas of the CF 12 corresponding to such areas in the periphery of the contact holes of the anodes 103a. Thus, the BMs 112 in the Y-axis direction have greater widths compared with the inter-subpixel BMs 112.

—Positional Relationship Between the BMs 112 and the CF Layers 113—

Figure 3B:
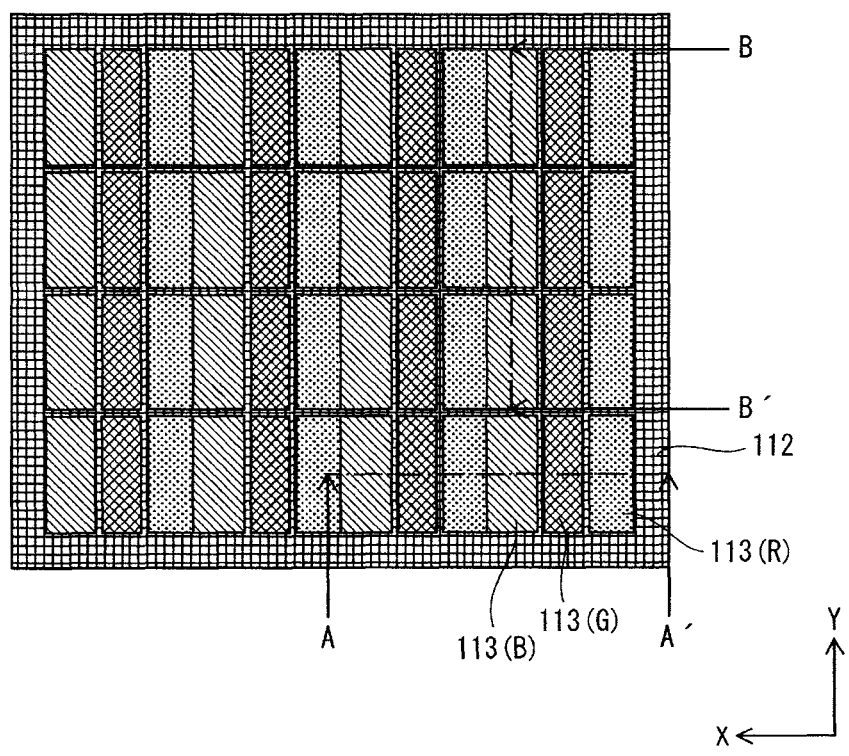

FIG. 3B is a schematic diagram illustrating a positional relationship between the BMs 112 and the CF layers 113 in the CF 12 of embodiment 1. As illustrated in FIG. 3B, three CF layers 113 (R), 113 (G), and 113(B) adjacent in the X-axis direction constitute one unit, and a plurality of such units are formed in a matrix on the CF 12. Further, a CF layer 113 (R) is extended in the direction of an adjacent CF layer 113 (B), and a CF layer 113 (B) is also extended in the direction of an adjacent CF layer 113 (R). Hence, the widths of the CF layers 113 (R) and the CF layers 113 (B) are greater than the width of the CF layers 113 (G) in the X-axis direction.

In the following, further detailed explanation is provided of the positional relationship between the BMs 112 and the CF layers 113 with reference to the accompanying FIG. 4.

FIG. 4A is a partial cross-sectional view (taken along line A-A' in FIG. 3B) illustrating a structure of the CF 12 of embodiment 1, and FIG. 4B is a partial cross-sectional view (taken along line B-B' in FIG. 3B) illustrating the structure of the CF 12 of embodiment 1. As illustrated in FIG. 4A, each of the CF layers 113 (R), 113 (G), and 113(B) is formed such that portions thereof extend over and cover top surfaces of edge portions of a pair of BMs 112. Here, note that the BMs 112 constituting a pair are respectively located at two sides of each of the CF layers 113 (R), 113 (G), and 113(B). Here, when focusing on one CF layer 113 (R) and one CF layer 113 (B) that are adjacent to each other, a portion of the CF layer 113 (R) formed so as to cover a top surface of an inter-pixel BM 112 extends towards the adjacent CF layer 113 (B) and similarly, a portion of the adjacent CF layer 113 (B) covering the top surface of the same inter-pixel BM 112 extends towards the CF layer 113 (R) such that the portions of the adjacent CF layers 113 (R) and 113 (B) overlap each other.

As such, when the CF 12 is seen as a whole, the overlapping portions of the adjacent CF layers (i.e. an inter-pixel area of the CF 12) faun a convexity, whereas the CF layers 113 (R), (G), and (B) formed within a portion of the CF 12 corresponding to a single pixel collectively form a concave.

In addition, in the CF 12 of the present embodiment, a portion of the CF layer 113 (R) and a portion of the CF layer 113 (B), which commonly cover a top surface of the same inter-pixel BM 112, overlap each other at a central region of the top surface of the inter-pixel BM 112.

Here, the film thickness th1 of each of the CF layers 113 (R), (G), and (B) is common, at 1 µm to 1.8 µm. The film thickness th2 of the convexity formed on the top surface of the inter-pixel BM 112 (a combined maximum film thickness of the overlapping portions) is 2 µm to 3.6 µm. Further, the film thickness of the BM 112 is, for example, 1 µm to 1.2 µm.

As such, concaves are not formed above the inter-pixel BMs 112 in the CF 12 of embodiment 1.

In addition, as illustrated in FIG. 4B, an end portion of a CF layer 113b (B) formed so as to cover a top surface of a BM 112 closer to an adjacent CF layer 113c (B) extends towards the CF layer 113c (B). Hence, the end portion of the CF layer 113b (B) formed so as to cover a top surface of the BM 112 closer to the adjacent CF layer 113c (B) has a greater length compared with the other end portion of the CF layer 113b (B) formed so as to cover a top surface of a BM 112 closer to an adjacent CF layer 113a (B).

Due to this, an interval l2 between (i) the portion of the CF layer 113b (B) formed so as to cover a top surface of a BM 112 closer to the adjacent CF layer 113c (B) and (ii) a portion of the adjacent CF layer 113c (B) formed so as to cover the top surface of the same BM 112 has a smaller length compared with an interval l5 in the CF for comparison, which is to be described in the following (refer to FIG. 6C) (that is, compared to a case where the portion of the CF layer 113b (B) formed so as to cover a top surface of a BM 112 does not extend towards the adjacent CF layer 113c (B)). Preferably, the interval l2 equals or falls within a predetermined range of approximation to an interval l1 illustrated in FIG. 4A (which is an interval between (i) the portion of the CF layer 113 (R) formed so as to cover a top surface of an inter-subpixel BM 112 and (ii) the portion of the adjacent CF layer 113 (G) formed so as to cover a top surface of the same inter-subpixel BM 112). Here, the predetermined range of approximation is, for instance, 50% to 150% with respect to the length of the interval l1. The length of the interval l1 is, for instance, 10 µm. Hence, in such a case, it is preferable that the length of the interval l2 be within a range of 5 µm to 15 µm.

Further, although not illustrated in 4B, the CF layers 113 (R) and 113 (G) have the same structure as the CF layers 113 (B) illustrated in FIG. 4B.

In the following, detailed explanation is provided of the material and the like for forming each of the components of the organic EL display panel 10.

<Structure of Components>

The TFT substrate 101 includes a substrate main body, a TFT, a wiring member, a passivation film and the like (undepicted). More specifically, the TFT and the wiring member are formed on the substrate main body, and further, the passivation film is formed so as to cover the TFT. The substrate main body is composed of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina. Alternatively, the substrate main body may be composed of an organic resin film.

The interlayer insulating film 102 is provided so as to planarize unevenness found on the surface of the TFT substrate 101, and is composed of an insulating material such as polyimide resin and acrylic resin.

The anodes 103a and the auxiliary electrodes 103b are formed by using Al (aluminum) or an aluminum alloy. Note that, the anodes 103a may also be formed by using Ag (silver), an alloy of silver, palladium, and copper, an alloy of silver, rubidium, and gold, MoCr (an alloy of molybdenum and chromium), NiCr (an alloy of nickel and chromium) or the like. Since the organic EL display panel 10 pertaining to embodiment 1 is a top emission type EL display panel, it is preferable that the anodes 103a be formed using reflective material.

The banks 104 are formed by using an organic material such as resin, and have insulating property. Examples of the organic material that can be used for forming the banks 104 include: acrylic resin; polyimide resin; and novolac type phenolic resin. Further, it is preferable that the banks 104 be formed by using material having resistance with respect to organic solvents. In addition, since there are cases where the banks 104 undergo etching, baking and other similar processing, it is preferable that the banks 104 be formed by using a material having a high degree of resistivity against such processing so as to avoid excessive deformation and degradation thereof.

Further, it is preferable that the organic light-emitting layer 105 be formed using such materials as recited, for example, in Japanese Patent Application Publication No. H5-163488. Such materials include fluorescent material, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc.

The cathode 106 is formed by using such material as ITO (indium tin oxide) and IZO (indium zinc oxide), for example. Since the organic EL display panel 10 is a top emission type EL display panel, it is preferable that the cathode 106 be formed by using light-transmissive material.

The sealing layer 107 inhibits the organic light-emitting layers 105 and the like from being exposed to moisture, air, etc., and formed by using a material such as SiO (silicon monoxide), SiN (silicon nitride), SiON (silicon oxynitride), SiC (silicon carbide), SiOC (silicon oxycarbide), AlN (aluminum nitride), and $Al_2O_3$ (aluminum oxide). Since the organic EL display panel 10 is a top emission type EL display panel, it is preferable that the sealing layer 107 be formed by using light-transmissive material.

The substrate main body 111 on which the CF 12 is formed is a front-side substrate of the organic EL display panel 10, and may be composed by using similar material as used in forming the substrate main body of the TFT substrate 101. However, since the organic EL display panel 10 is a top emission type EL display panel, it is required that the substrate main body 111 have excellent transparency.

The BMs 112 are black-colored layers provided so as to prevent incident light from the outside from being reflected against the display surface of the organic EL display panel 10 and from entering the organic EL display panel 10. In other words, the BMs 112 are provided so as to improve the display contrast property of the organic EL display panel 10. Hence, the BMs 112 are to be formed by using ultraviolet setting resin material that includes black pigment, which has excellent light-absorbing and light-blocking properties.

The CF layers (R), (G), and (B) are formed by using conventional resin material transmitting visible light of wavelength regions corresponding to the respective colors red, blue, and green.

The resin sealing layer 121 is disposed so as to prevent the permeation of moisture, gasses, etc., from the outside and is formed of various transparent resin materials (epoxy resin, acrylic resin, silicone resin and the like). The viscosity of the resin material is to be set appropriately taking into consideration how the resin material spreads and the degree of adhesion yielded by the resin material, and is, for instance, 500 mPa·s.

<Manufacturing Method>

Figure 5A:
FIGS. 5A, 5B, 5C, 5D, 5E, and 5F each illustrate a step involved in one example of manufacturing procedures of the CF of embodiment 1.
Figure 5B:
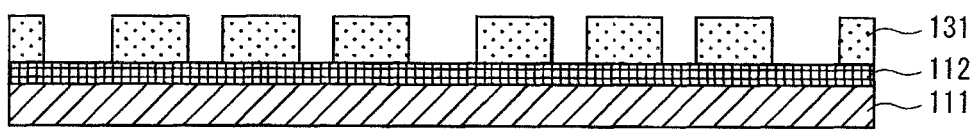

In the following, an example of manufacturing procedures of the CF 12 is described. FIGS. 5A through 5F illustrate one example of the manufacturing procedures of the CF 12. Firstly, a BM paste is prepared by dispersing BM material in a solvent. The BM material is yielded by adding black pigment to ultraviolet setting resin (for instance, ultraviolet setting acrylic resin) material, which is the main component. The BM paste is applied to one surface of the substrate main body 111 (FIG. 5A).

When the BM paste having been applied to the surface of the substrate main body 111 dries and the solvent included therein volatilizes to a predetermined degree where the BM paste is able to maintain its form, a pattern mask having openings of a predetermined shape is laminated onto the BM paste. Here, the openings of the pattern mask are in correspondence with the positions of the banks 104, which are formed on the EL substrate 11. Then, eradiation of ultraviolet rays is performed from over the pattern mask.

Figure 5C:

Subsequently, baking is performed of the BM paste, which has been applied to the surface of the substrate main body 111 and from which the solvent has been removed. Further, developing is performed by removing the pattern mask and the unhardened BM paste and curing is performed of the BM paste. As a result, the BMs 112 are formed at positions corresponding to the positions of the banks 104 as illustrated in FIG. 5C.

Subsequently, application of a paste (R) is performed with respect to the surface of the substrate on which the BMs 112 have been formed. The paste (R) is prepared by dispersing material for forming the CF layer 113 (R) in a solvent. The material for forming the CF layer 113 (R) includes ultraviolet setting resin as the main component. After a certain quantity of the solvent included in the paste (R) has been removed, a predetermined pattern mask is mounted onto the surface of the paste (R), and eradiation of ultraviolet rays is performed.

Figure 5D:
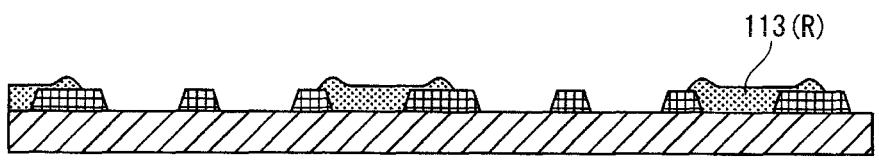

Following this, by curing the paste (R) and further, by developing the paste (R) by removing the pattern mask and unhardened portions of the paste (R), the CF layers 113 (R) are formed as illustrated in FIG. 5D.

The CF layers 113 (R) are formed so as to be defined by the shapes of the BMs 112. Further, portions of each of the CF layers 113 (R) cover the top surfaces of edge portions of a pair of BMs 112. Here, note that the BMs 112 constituting a pair are respectively located at two sides of each of the CF layers 113 (R). In addition, a portion of the CF layer 113 (R) formed so as to cover the top surface of an inter-pixel BM 112 has a greater length than a portion of the CF layer 113 (R) formed so as to cover the top surface of an inter-subpixel BM 112.

Figure 5E:
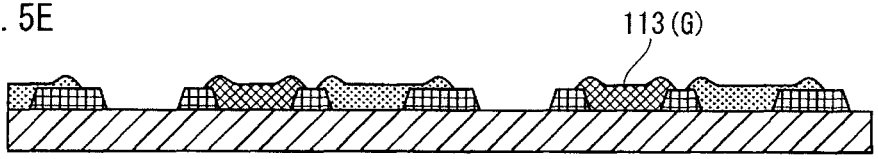
Figure 5F:
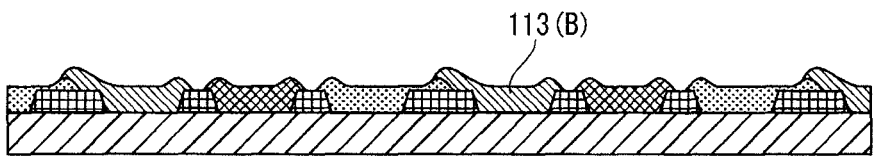

The CF layers 113 (G) and the CF layers 113 (B) are similarly formed by repeating the above-described procedures for forming the CF layers 113 (R) by using CF material of the respective colors G and B. As a result, the CF layers 113 (G) and the CF layers 113 (B) are each formed at locations of the CF 12 corresponding to the locations of the corresponding organic light-emitting layers 105 (FIGS. 5E and 5F).

More specifically, the CF layers 113 (G) and the CF layers 113 (B) are also formed so as to be defined by the shapes of the BMs 112. Further, portions of each CF layer 113 (G) and the CF layer 113 (B) cover top surfaces of edge portions of a pair of BMs 112 that are respectively located at both sides thereof. Here, concerning the CF layers 113 (B), it should be noted that, a portion of a CF layer 113 (B) formed so as to cover a top surface of an inter-pixel BM 112 has a greater length than a portion of the CF layer 113 (B) formed so as to cover a top surface of an inter-subpixel BM 112. In addition, a portion of a CF layer 113 (B) formed so as to cover a top surface of an inter-subpixel BM 112 overlaps a portion of a CF layer 113 (R) formed so as to cover the top surface of the same inter-pixel BM 112.

On the other hand, concerning the CF layers 113 (G), it should be noted that portions of a CF layer 113 (G) formed so as to cover top surfaces of BMs 112 located at both sides thereof are not extended.

The CF 12 pertaining to the present embodiment is formed by following the above-described procedures.

The following provides a brief explanation of procedures following this point. Firstly, a sealant (DAM) paste for providing sealing between the EL substrate 11 having been formed following predetermined procedures and the CF 12 is applied to an outer boundary portion of the CF 12 having been formed as described in the above. Subsequently, resin material (FILL) for resin sealing is dropped at predetermined intervals to portions of the CF 12 excluding the outer boundary portion. When the dropping of resin material is completed, the EL substrate 11 and the CF 12 are adhered to each other in a vacuum state. Further, when the sealing process is completed by baking the EL substrate 11 and the CF 12 adhered to each other, the organic EL display panel 10 is completed.

<Comparison between the CF of the Present Embodiment and a CF for Comparison>

In the following, explanation is provided of the difference between the CF 12 of the present embodiment and the CF for comparison, particularly concerning the manner in which resin spreads when applied to the CFs. Here, the CF used for comparison with the CF 12 of the present invention is a CF in which portions of the CF layers formed so as to cover the inter-pixel BMs 112 are not extended. In the following, explanation is provided of the CF for comparison.

(Positional Relationship between BMs 212 and CF layers 213 in the CF for Comparison)

Figure 6A:
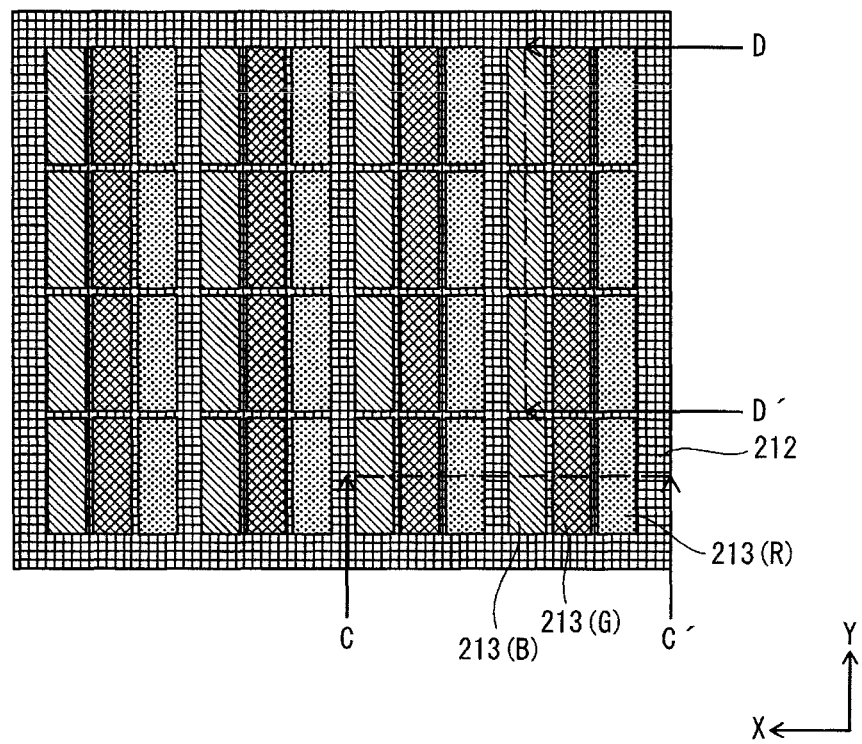
FIG. 6A is a schematic diagram illustrating a positional relationship between BMs and CF layers for comparison.

The locations at which the BMs are arranged in the CF for comparison are similar to the locations of the BMs illustrated in FIG. 3A. FIG. 6A is a schematic diagram illustrating a positional relationship between the BMs and the CF layers in the CF for comparison. As illustrated in FIG. 6A, three CF layers 213 (R), 213 (G), and 213(B) adjacent in the X-axis direction constitute one unit, and a plurality of such units are formed in a matrix. The positional relationship between the BMs and the CF layers illustrated in FIG. 6A is similar to the positional relationship illustrated in FIG. 3B. However, it is to be noted that the CF layers 213 (R), (G), and (B) of the CF for comparison have the same width in the X-axis direction and also, the same width in the Y-axis direction.

In the following, further detailed explanation is provided of the positional relationship between the BMs 212 and the CF layers 213 with reference to the accompanying FIGS. 6B and 6C.

Figure 6B:
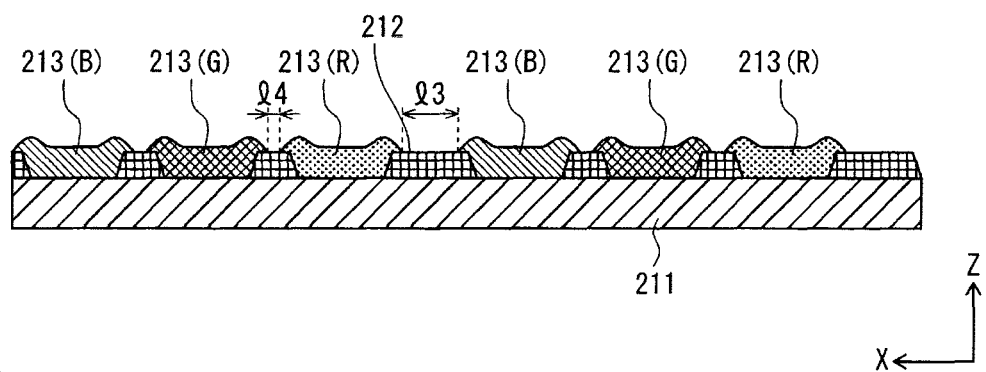
FIG. 6B is a partial cross-sectional view (taken along line C-C' in FIG. 6A) illustrating the structure of a CF for comparison.
Figure 6C:
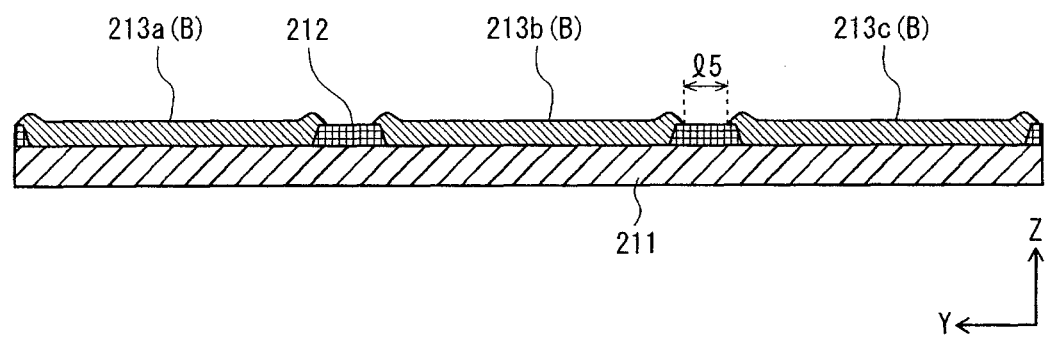
FIG. 6C is a partial cross-sectional view (taken along line D-D' in FIG. 6A) illustrating a structure of the CF for comparison.

FIG. 6B is a partial cross-sectional view (taken along line C-C' in FIG. 6A) illustrating the structure of the CF for comparison and FIG. 6C is a partial cross-sectional view (taken along line D-D' in FIG. 6A) also illustrating the structure of the CF for comparison. As illustrated in FIG. 6B, portions of each of the CF layers 213 (R), 213 (G), and 213(B) cover the top surfaces of edge portions of a pair of BMs 212 that are respectively located at two sides of each of the CF layers 213, which is similar to the CF 12 of embodiment 1. However, when focusing on one CF layer 213 (R), a portion of the CF layer 213 (R) formed so as to cover a top surface of an inter-pixel BM does not extend towards an adjacent CF layer 213 (B). Subsequently, when focusing on one CF layer 213 (B), a portion of a CF layer 213 (B) formed so as to cover a top surface of an inter-pixel BM does not extend towards an adjacent CF layer 213 (R), similar as the CF layer 213 (R). In other words, the portions of the CF layer 213 (R) and the CF layer 213 (B) formed so as to cover top surfaces of inter-pixel BMs have the same widths as portions of the CF layer 213 (R) and the CF layer 213 (B) formed so as to cover top surfaces of inter-subpixel BMs.

As such, an interval l3 between (i) a portion of a CF layer 213 (R) formed so as to cover a top surface of an inter-pixel BM and (ii) a portion of an adjacent CF layer 213 (B) formed so as to cover the top surface of the same inter-pixel BM has a greater length than an interval l4 between (i) a portion of the CF layer 213 (R) formed so as to cover a top surface of an inter-subpixel BM and (ii) a portion of an adjacent CF layer 213 (G) formed so as to cover the top surface of the same inter-subpixel BM. For instance, when the length of the interval l4 is 10 μm, the length of the interval l3 is 40 μm.

In addition, as illustrated in FIG. 6C, an end portion of a CF layer 213b (B) formed so as to cover a top surface of a BM 212 closer to an adjacent CF layer 213c (B) does not extend towards the adjacent CF layer 213c (B). Due to this, an interval l5 between (i) the portion of the CF layer 213b (B) formed so as to cover a top surface of a BM 212 closer to the adjacent CF layer 213c (B) and (ii) a portion of the adjacent CF layers 213c (B) formed so as to cover the top surface of the same BM 212 has a greater length than the interval l4. For instance, when the length of the interval l4 is 10 μm, the length of the interval l5 is 40 μm.

Further, although not illustrated, the CF layers 213 (R) and the CF layers 213 (G) have the same structure as the CF layers 213 (B) illustrated in FIG. 6C.

As such, concaves having comparatively great widths are formed on the inter-pixel BMs 212 in both the X-axis and Y-axis directions in the CF for comparison.

(Spread of Resin in the CF for Comparison)

Figure 7A:
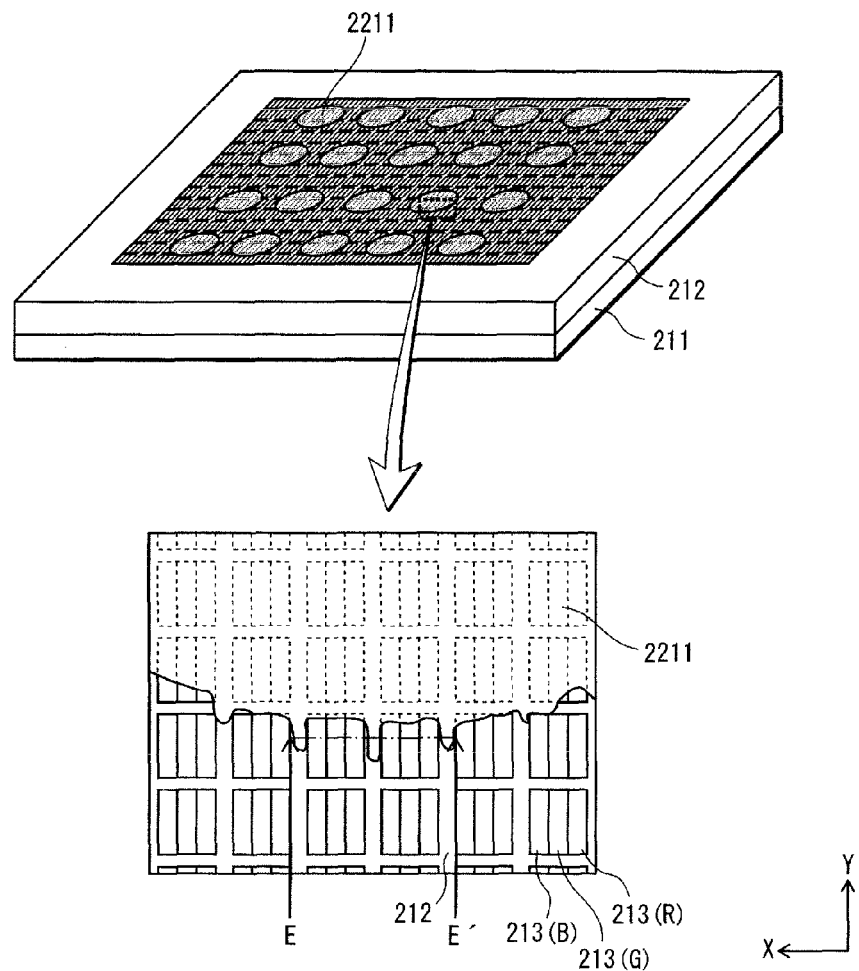
FIG. 7A includes: an upper portion which is a schematic diagram illustrating a state where resin is dropped on the CF for comparison; and a lower portion which is a schematic diagram illustrating how resin spreads over the CF for comparison.
Figure 7B:
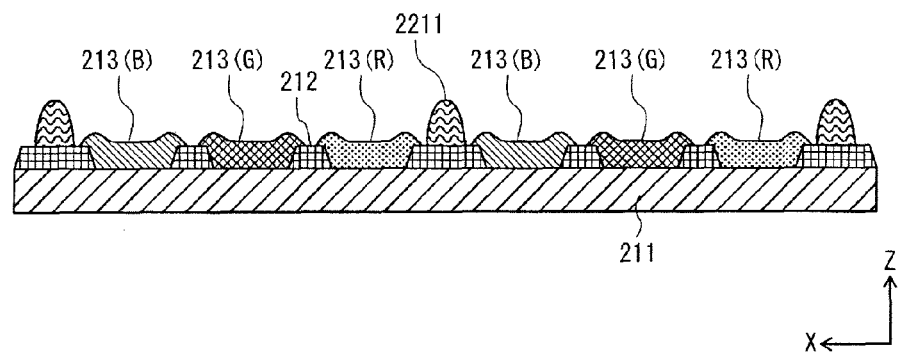
FIG. 7B is a schematic diagram (taken along line E-E' in FIG. 7A) illustrating the structure of the CF for comparison in a state where resin has been dropped thereon.

FIG. 7A includes: an upper portion which is a schematic diagram illustrating a state where several drops of resin 2211 have been dropped on the CF for comparison and a lower portion which is a schematic diagram illustrating how resin spreads over the CF for comparison. FIG. 7B is a schematic diagram (taken along line E-E' in FIG. 7A) illustrating a structure of the CF for comparison in a state where the resin 2211 has been dropped.

As illustrated in the upper portion of FIG. 7A, few drops of the resin 2211 are dropped on the CF for comparison at predetermined intervals. When the resin 2211 is dropped, the resin 2211 begins to spread over the CF for comparison. As illustrated in the lower portion of FIG. 7A and FIG. 7B, the resin 2211 spreads starting from over the inter-pixel BMs 112, rather than starting from over the CF layers. This is since the CF has a concavoconvex form, and the top surfaces of the BMs are located lower in level compared with the top surfaces of the CF layers. Hence, the top surfaces of the BMs, which are located lower in level, form paths over which resin spreads. Here, it should be noted that, although the top surfaces of the inter-subpixel BMs are located lower in level compared with the top surfaces of the CF layers, the intervals between adjacent CF layers at the top surfaces of the inter-subpixel BMs are sufficiently short. Hence, it is assumed that surface tension prevents resin from spreading over the top surfaces of the inter-subpixel BMs.

As such, resin spreads starting from over the top surfaces of the inter-pixel BMs 112 in the CF for comparison, which gives rise to the existence of areas above the CF layers that resin has not spread over. Due to this, in the organic EL display panel 10, which is yielded by adhering the CF and the EL substrate to each other, resin-unfilled portions remain in areas corresponding to the organic light-emitting layers.

Figure 8:
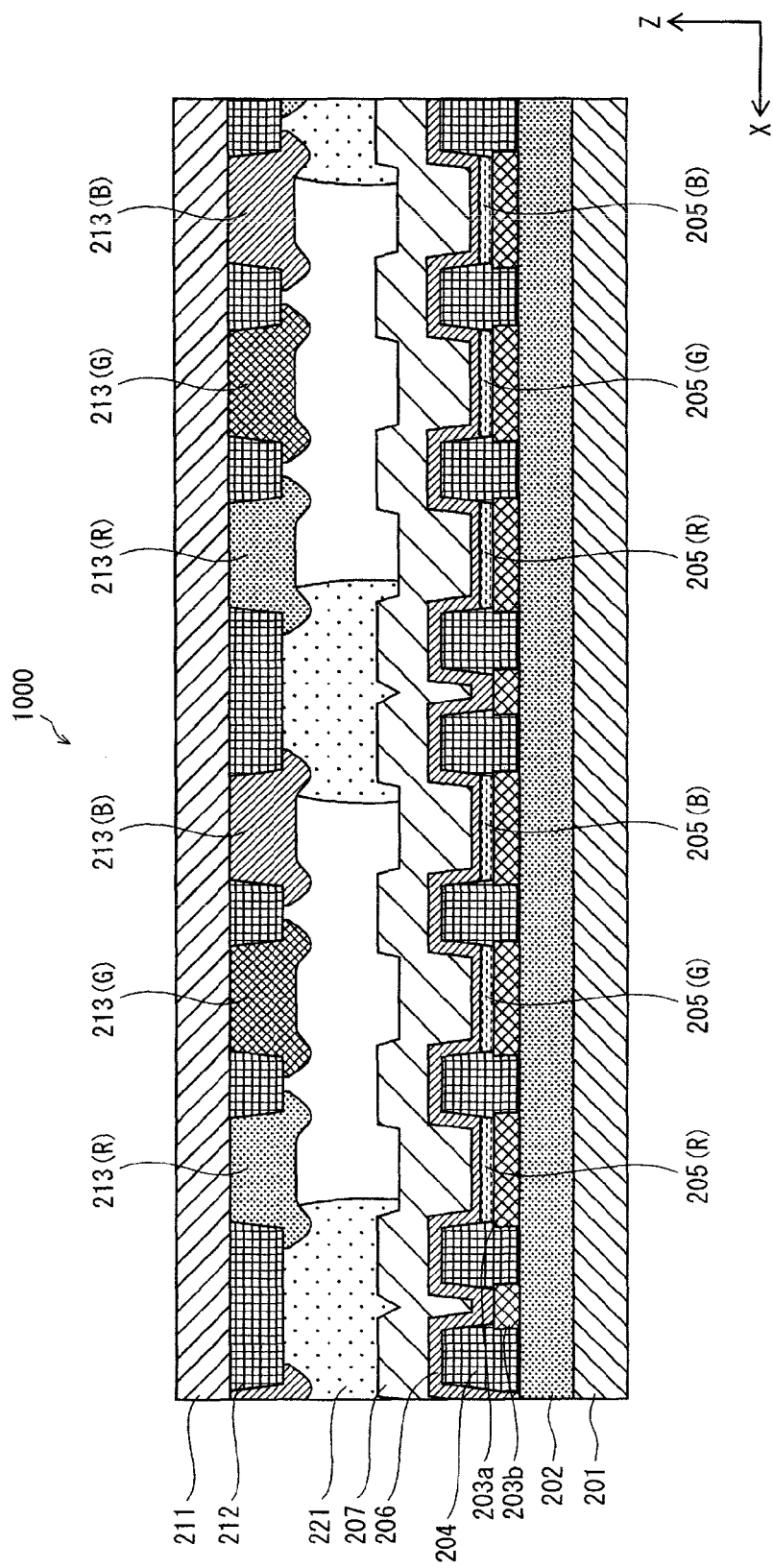
FIG. 8 is a schematic partial cross-sectional end-view illustrating a structure of an organic EL display panel 1000 incorporating the CF for comparison.

FIG. 8 is a schematic partial cross-sectional end-view illustrating a structure of an organic EL display panel 1000 incorporating the CF for comparison. The white portions in FIG. 8 indicate resin-unfilled areas of the organic EL display panel 1000. As illustrated in FIG. 8, in the organic EL display panel 1000 incorporating the CF for comparison, resin spreads to the side of the organic light-emitting layers to some extent by the pressure applied when the CF and the EL substrate are adhered together. However, the occurrence of resin-unfilled portions is not completely inhibited.

Accordingly, areas of the organic EL display panel 1000 corresponding to the inter-pixel BMs are filled with the resin 2211, whereas areas corresponding to the organic light emitting layers remain unfilled with resin, resulting in the occurrence of resin-unfilled portions.

Although the explanation in the above has been provided concerning the spread of resin in the Y-axis direction, the same applies to the spread of resin in the X-axis direction, since concaves having comparatively great widths similarly exist in the X-axis direction.

(Spread of Resin in the CF 12 of the Present Embodiment)

Figure 9A:
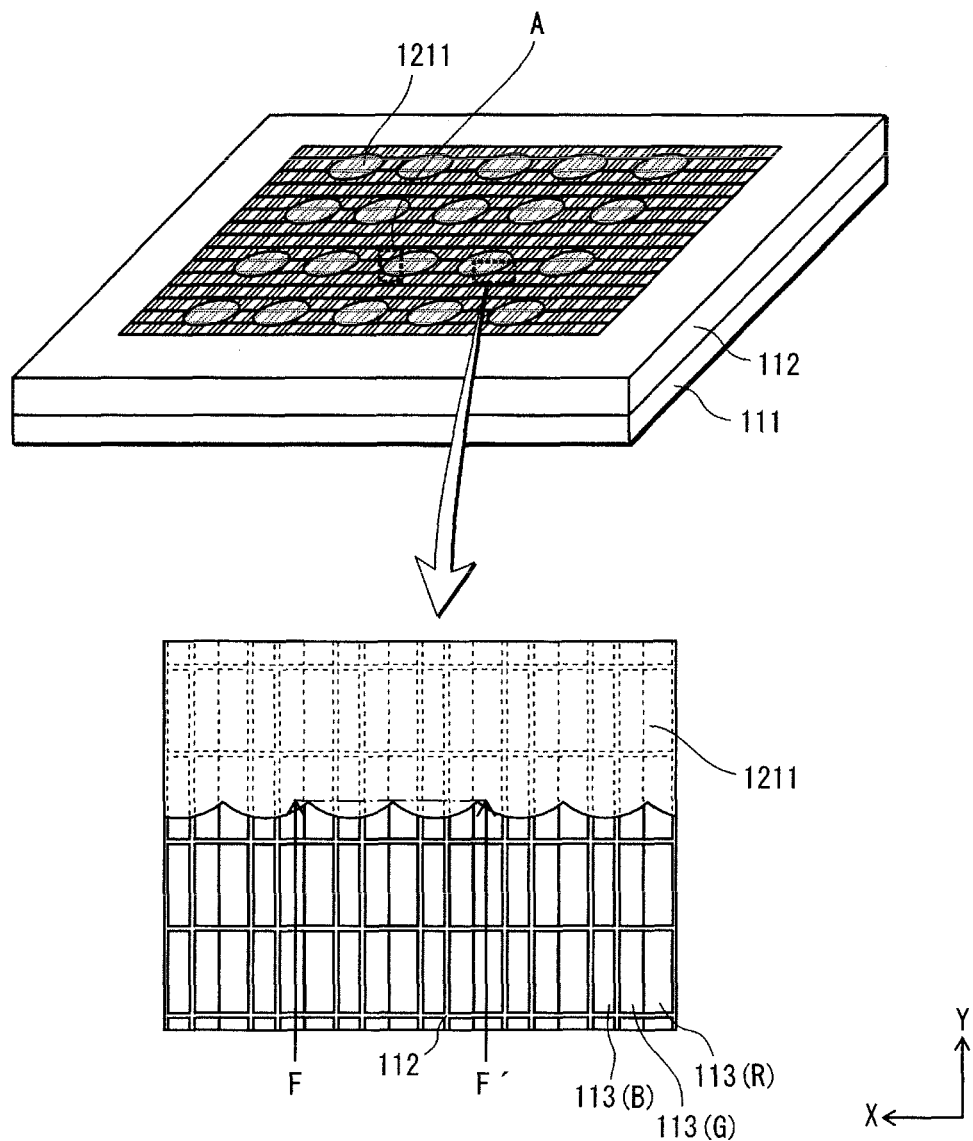
FIG. 9A includes: an upper portion which is a schematic diagram illustrating a state where resin is dropped on the CF of embodiment 1; and a lower portion which is a schematic diagram illustrating how resin spreads over the CF of embodiment 1.
Figure 9B:
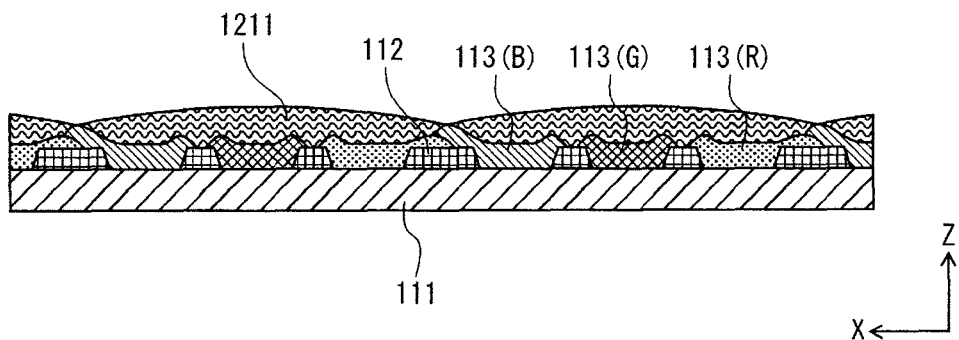
FIG. 9B is a schematic diagram (taken along line F-F' in FIG. 9A) illustrating the structure of the CF of embodiment 1 in a state where resin has been dropped thereon.

Subsequently, explanation is provided concerning the manner in which resin spreads when dropped on the CF 12 of the present embodiment. FIG. 9A includes: an upper portion which is a schematic diagram illustrating a state where resin has been dropped on the CF 12 of embodiment 1; and a lower portion which is a schematic diagram illustrating how resin spreads over the CF 12 of embodiment 1. FIG. 9B is a schematic diagram (taken along line F-F' in FIG. 9A) illustrating the structure of the CF 12 of embodiment 1 in a state where resin has been dropped.

When viewing the CF 12 of the present invention as a whole, a convexity is formed above a top surface of each of the inter-pixel BMs, whereas a concave is collectively formed by the CF layers 113 (R), (G), and (B) within each of the areas corresponding to a pixel.

Due to this, although there exists a difference in level between the BMs 112 and the CF layers, concaves having comparatively great widths do not exist on the top surfaces of the inter-pixel BMs.

As is clear from the manner in which resin spreads over the CF for comparison, resin spreads starting from over concaves having comparatively great widths. Since the CF layers 113 (R), (G), and (B) formed within an area corresponding to a pixel collectively form a concave having a comparatively great width when the CF 12 of embodiment 1 is seen as a whole, resin 1211 spreads starting from over the CF layers 113 (R), (G), and (B) as illustrated in the lower portion of FIG. 9A, which is the contrary of the manner in which resin spreads in the CF for comparison.

As such, a state where a large amount of resin spreads only over concaves formed above the top surfaces of the inter-pixel BMs, as observed in the CF for comparison, is suppressed from occurring.

As such, when the CF and the EL substrate are adhered to each other, resin appropriately fills the areas corresponding to the organic light-emitting layers as illustrated in FIG. 2.

In addition, in the CF 12 of the present embodiment, a portion of a CF layer 113 (R) formed so as to cover an inter-pixel BM 112 and a portion of an adjacent CF layer 113 (B) formed so as to cover the same inter-pixel BM 112 overlap each other at a central region of the inter-pixel BM 112. Hence, as illustrated in FIG. 9B, an even spread of resin over the adjacent portions of the CF 12 corresponding to adjacent pixels is promoted, which further results in a suppression of the difference in the degree at which each of the two adjacent portions is filled with resin. In addition, since resin spreads evenly over each of the portions, the forming of resin-unfilled portions is suppressed in each of the portions.

Figure 10A:
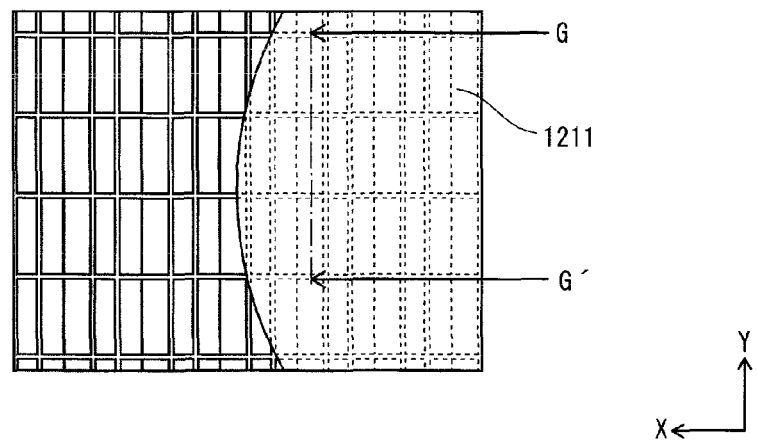
FIG. 10A is a schematic diagram illustrating a state where resin is dropped on the CF of embodiment 1 (particularly in an area A in FIG. 9A)
Figure 10B:
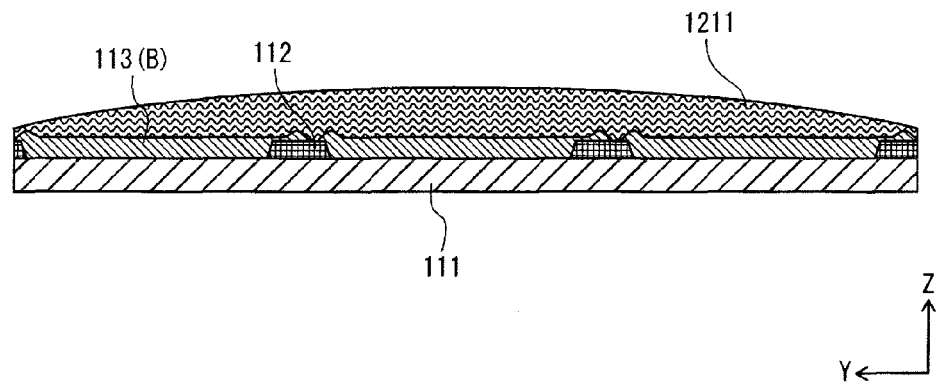
FIG. 10B is a schematic diagram (taken along line G-G' in FIG. 9A) illustrating the structure of the CF of embodiment 1 in a state where resin has been dropped thereon.

The explanation in the above has been provided concerning the spread of resin in the Y-axis direction. In the following, explanation is provided concerning the spread of resin in the X-axis direction with reference to the accompanying FIGS. 10A and 10B. FIG. 10A is a schematic diagram illustrating a state where resin is dropped on the CF 12 of embodiment 1 (particularly in an area A in FIG. 9A) and FIG. 10B is a schematic diagram (taken along line G-G' in FIG. 9A) illustrating the structure of the CF 12 of embodiment 1 in a state where resin has been dropped thereon. As illustrated in FIGS. 4A and 4B, the interval l2 above a top surface of an inter-pixel BM 112 equals or falls within a predetermined range of approximation to the interval l1 above a top surface of an inter-subpixel BM 112. Due to this, although there exists a difference in level between the BMs 112 and the CF layers (R), (G), and (B), concaves having comparatively great widths do not exist on the top surfaces of the inter-pixel BMs. Hence, resin does not spread starting from over the concaves existing on the top surfaces of the inter-pixel BMs but spreads concentrically over the CF 12 as illustrated in FIG. 10A and FIG. 10B.

As such, a state where a large amount of resin spreads only over the concaves formed above the top surfaces of the inter-pixel BMs, as observed in the CF for comparison, is suppressed from occurring with respect to the X-axis direction as well.

According to the present embodiment, a portion of a CF layer 113 (B) formed so as to cover a top surface of an inter-pixel BM 112 extends towards an adjacent CF layer 113 (R), and at the same time, overlaps a portion of the adjacent CF layer 113 (R) covering the top surface of the same inter-pixel BM 112.

Hence, even though the inter-pixel BMs 112 have comparatively greater widths than the inter-subpixel BMs 112, concaves having comparatively great widths, which form paths over which resin spreads, are not formed above the inter-pixel BMs 112.

In fact, since adjacent CF layers 113 (R) and 113 (G) overlap each other above the inter-pixel bank, a convexity is formed above each of the inter-pixel banks when the CF 12 is seen as a whole. On the other hand, when viewed in relation to such a convexity, the CF layers 113 (R), (G), and (B) formed within an area corresponding to a pixel collectively form a concave when the CF is seen as a whole.

That is, the CF layers 113 (R), (G), and (B) within a portion corresponding to a pixel collectively form a concave, which forms a path over which resin spreads. Hence, resin applied to the CF 12 is suppressed from spreading over the convexities formed above the inter-pixel BMs 112, whereas the spread of resin over the concaves formed by the CF layers (R), (G), and (B) is promoted.

Accordingly, since the spread of resin over each of the CF layers 113 is promoted, the forming of resin-unfilled portions at areas corresponding to the organic light-emitting layers in the organic EL display panel 10, which is yielded by adhering the CF 12 and the EL substrate 11 together, is suppressed.

In addition, in the organic EL display panel 10 of the present embodiment, the convexities above the inter-pixel BMs 112 are formed not by using a separate material for the specific purpose, but by using and extending the CF layers, which are conventionally included in an organic EL display panel. Hence, the forming of resin-unfilled portions is suppressed by applying a simple structure.

Modification 1-1

Figure 11:
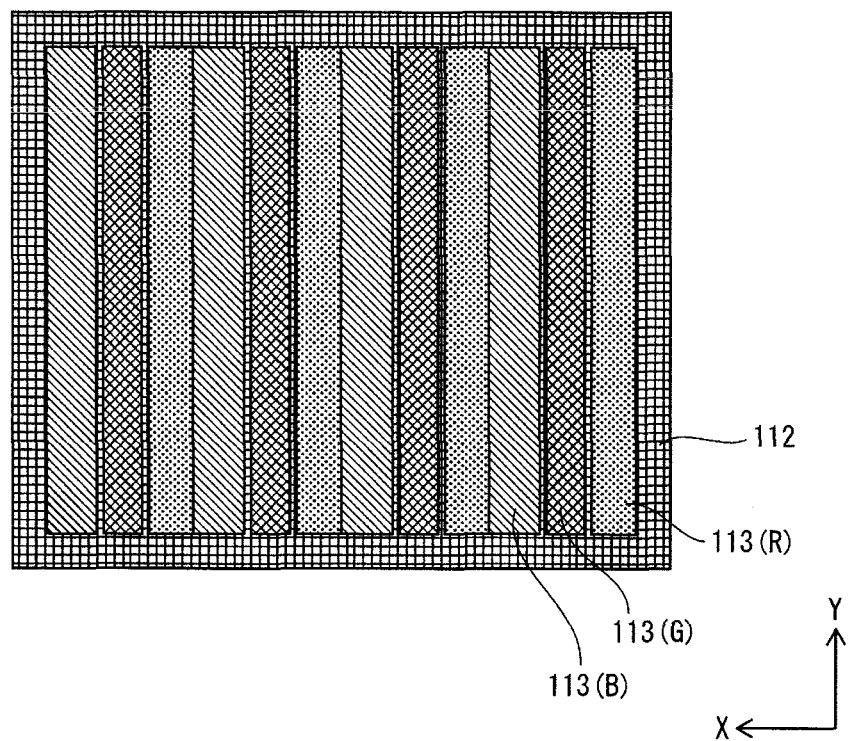
FIG. 11 is a schematic diagram illustrating a positional relationship between BMs and CF layers of modification 1-1.

Subsequently, explanation is provided of one modification where the CF layers are formed to form stripes in the CF. FIG. 11 is a schematic diagram illustrating a positional relationship between the BMs and the CF layers of modification 1-1. As illustrated in FIG. 11, a CF layer 113 (R) extends towards an adjacent CF layer 113 (B), and the CF layer 113 (B) extends towards the CF layer 113 (R), which is similar as in the CF 12 illustrated in FIG. 3B. However, in the CF 12 of modification 1-1, the CF layers 113 (R), (G), and (B) form stripes in the CF 12. That is, in the Y-axis direction, each of the CF layers 113 (R), (G), and (B) is formed continuously, rather than being formed by performing pattering with respect to the areas corresponding to subpixels.

Due to this, concaves on the top surfaces of the BMs 112 do not exist in the Y-axis direction, and therefore, the spread of resin over the CF layers 113 (R), (G), and (B) is further promoted.

Here, the locations at which the BMs 112 are arranged are similar to the locations of the BMs 112 in FIG. 3A.

Embodiment 2

In the present embodiment, explanation is provided of a CF in which BMs are not formed and only CF layers corresponding to the respective colors R, G, and B are formed.

<Structure of the Organic EL Display Panel>

(Overall Structure of the Organic EL Display Panel)

Figure 12:
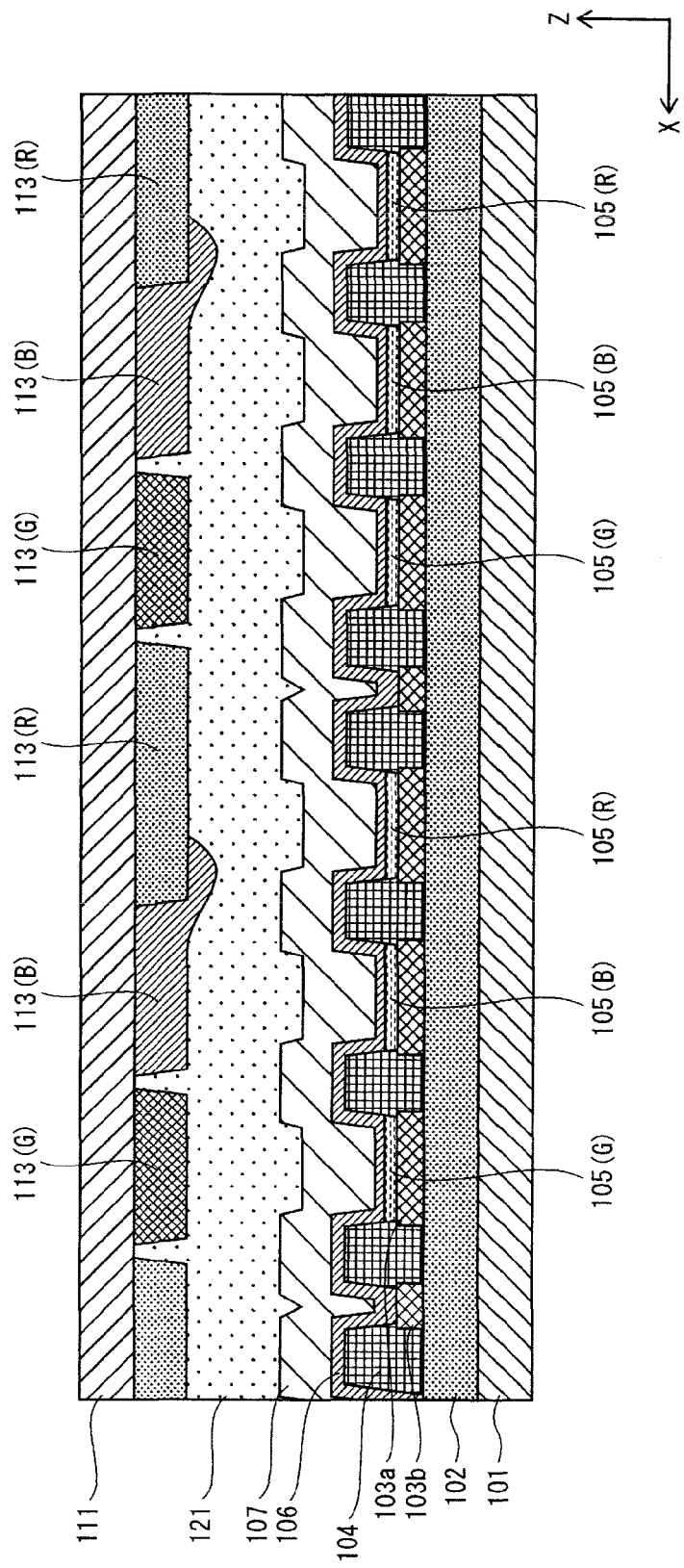
FIG. 12 is a partial cross-sectional view illustrating a structure of an organic EL display panel of embodiment 2.

In the following, detailed explanation is provided of the structure of an organic EL display panel of the present embodiment. FIG. 12 is a partial schematic cross-sectional view illustrating a main part of the organic EL display panel of embodiment 2. As illustrated in FIG. 12, CF layers 113 (R), (G), and (B) are formed on one surface of the substrate main body 111 (a surface facing the EL substrate 11). More specifically, a CF layer 113 of a corresponding color, among (R), (G), and (B) is formed at an area on the surface of the main substrate body 111 corresponding to each of the organic light-emitting layers 105 (R), (G), and (B).

Since the EL substrate 11 is similar to the EL substrate 11 described in embodiment 1, explanation thereof is omitted in the following.

Figure 13A:
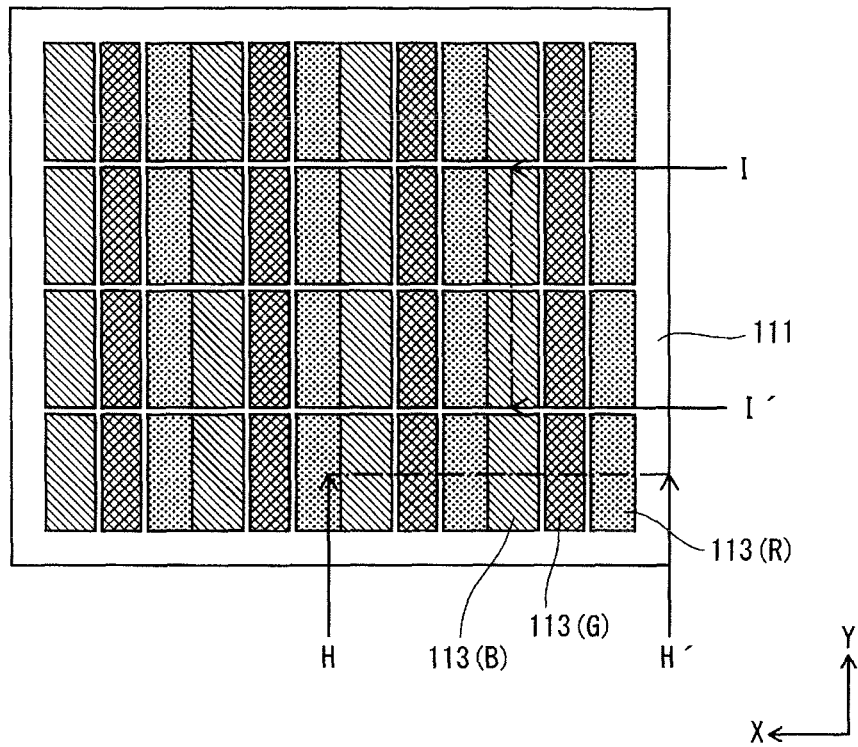
FIG. 13A is a schematic diagram illustrating a positional relationship of CF layers of embodiment 2.

Subsequently, detailed explanation is provided of a structure of the CF 12. FIG. 13A is a schematic diagram illustrating a positional relationship of the CF layers of embodiment 2. As illustrated in FIG. 13A, a CF layer 113 (R) extends towards an adjacent CF layer 113 (B), and the CF layer 113 (B) extends towards the CF layer 113 (R). Hence, the width of each of the CF layers 113 (R) and each of the CF layers 113 (B) is greater than the width of each of the CF layers 113 (G) in the X-axis direction.

Figure 13B:
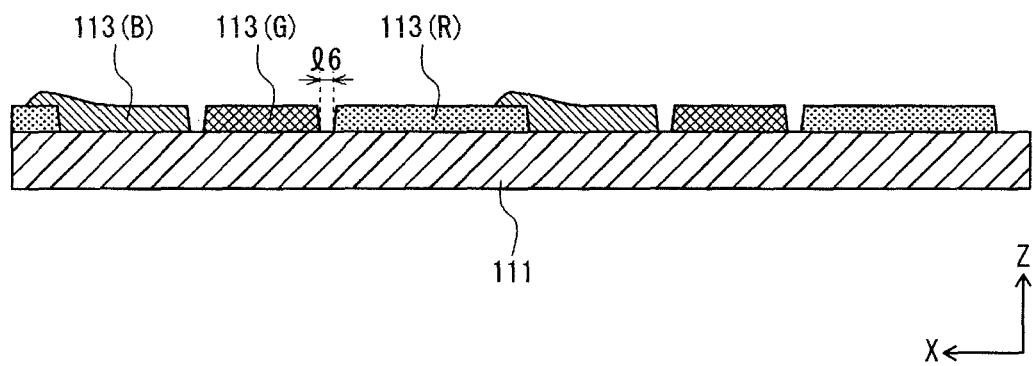
FIG. 13B is a partial cross-sectional view (taken along line H-H' in FIG. 13A) illustrating a structure of a CF of embodiment 2.
Figure 13C:
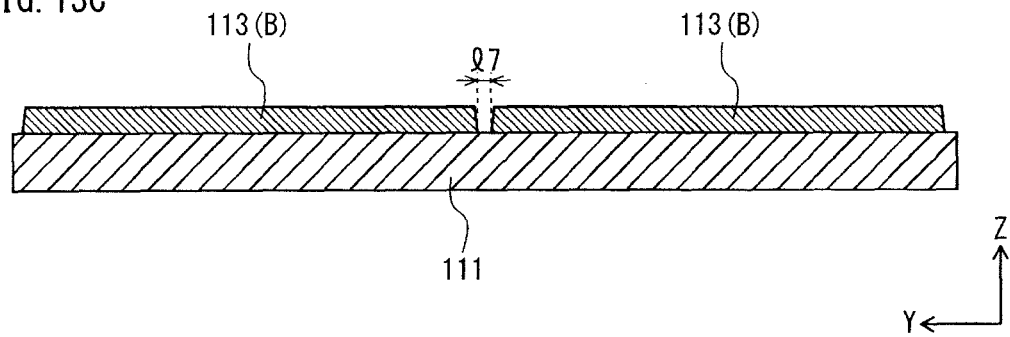
FIG. 13C is a partial cross-sectional view (taken along line I-I' in FIG. 13B) illustrating the structure of the CF of embodiment 2.

In the following, further detailed explanation is provided of the positional relationship of the CF layers 113 with reference to the accompanying FIGS. 13B and 13C. FIG. 13B is a partial cross-sectional view (taken along line H-H' in FIG. 13A) illustrating the structure of the CF of embodiment 2. FIG. 13C is partial cross-sectional view (taken along line I-I' in FIG. 13A) illustrating the structure of the CF of embodiment 2.

In FIG. 13B, when focusing on a CF layer 113 (R) and a CF layer 113 (B) that is adjacent to the CF layer 113 (R), an edge portion of the CF layer 113 (R) closer to the CF layer 113 (B) and an edge portion of the CF layer (B) closer to the CF layer 113 (R) overlap each other.

Accordingly, when the CF 12 is seen as a whole, the overlapping portions of the CF layers (a portion corresponding to an inter-pixel area) form a convexity, whereas the CF layers 113 (R), (G), and (B) formed within an area corresponding to one pixel collectively form a concave.

In addition, as illustrated in FIGS. 13A and 13C, the CF layers 113 (B) are extended in the Y-axis direction. Preferably, an interval l7 between adjacent CF layers 113 (B) equals or falls within a predetermined range of approximation to the interval l6 illustrated in FIG. 13B. The predetermined range of approximation is as already provided in embodiment 1.

Further, although not illustrated, the CF layers 113 (R) and the CF layers 113 (G) have the same structure as the CF layers 113 (B) illustrated in FIG. 13C.

In the CF as described in the above in which only the CF layers 113 (R), (G), and (B) are formed, areas between adjacent CF layers form concaves when the CF is seen as a whole. However, by extending a CF layer 113 (R) towards an adjacent CF layer 113 (G) and extending the CF layer 113 (G) towards the CF layer 113 (R), and further, by causing portions of the CF layer 113 (R) and the CF later 113 (G) to overlap each other in the above-described manner, a convexity is formed at an area lying between adjacent CF layers when the CF is seen as a whole. Further, when viewed in relation to such a convexity, the CF layer 113 (R), a CF layer 113 (G), and a CF layer 113 (B) collectively form a concave. Hence, resin applied to the CF is suppressed from spreading over the convexities formed at areas between adjacent CF layers, whereas the spread of resin over the CF layer 113 (R), the CF layer 113 (G), and the CF layer 113 (B), which collectively form a concave, is promoted.

Since the spread of resin over each of the CF layers 113 (R), (G), and (B) is promoted, the forming of resin-unfilled portions at areas corresponding to the organic light-emitting layers in the organic EL display panel, which is yielded by adhering the CF 12 and the EL substrate 11 together, is suppressed.

In addition, in the CF 12 of the present embodiment, the concaves formed between CF layers adjacent in the Y-axis direction are reduced in terms of length by extending each of the CF layers 113 (R), (G), and (B) in the Y-axis direction. The spread of resin over the CF layers is promoted by forming the CF layers in such a manner.

In addition, in the organic EL display panel of the present embodiment, the convexities between adjacent CF layers are formed not by using a separate material for the specific purpose, but by using and extending the CF layers, which are conventionally included in an organic EL display panel. Hence, the forming of resin-unfilled portions is suppressed by applying a simple structure.

Here, it should be noted that the CF layers (R), (G), and (B) may form stripes in the CF 12.

(Supplement)

Although description has been provided in the above on the organic EL display panel pertaining to the present invention with reference to embodiments thereof, the present invention is not limited to such embodiments, and various modifications as described in the following are construed as being included in the scope of the present invention.

(1) In the EL substrate 11, a hole injection layer, a hole transport layer, or a hole injection/transport layer may be interposed between an anode 103 and an organic light-emitting layer 105 as necessary. Similarly, an electron injection layer, an electron transport layer, or an electron injection/transport layer may be interposed between the cathode 106 and an organic light-emitting layer 105 as necessary.

(2) In the embodiments above, explanation has been provided taking the CF 12 of the organic EL display panel as an example. However, the present invention is not limited to this, and the CF 12 may be incorporated in an inorganic EL display panel.

(3) In the embodiments, explanation has been provided taking the BMs 112 as an example of banks partitioning the first area 114, the second area 115, and the third area 116 from each other. However, the banks are not limited to the BMs 112 and may be other banks, provided that such banks function as partitions between the areas. For instance, the banks may be composed of ultraviolet setting resin material including pigment of a color other than black.

(4) In the embodiments, explanation has been provided concerning a structure where outermost portions of adjacent CF layers overlap each other at a central region of an inter-pixel BM 112 lying between the two adjacent portions. However, the region of the inter-pixel BM 112 at which the edge portions overlap each other is not limited to the central region. That is, the outermost portions of the CF layers may overlap each other at any location, provided that the outermost portions overlap each other on the top surface of the inter-pixel BM 112.

(5) In the embodiments, the CF layers 113 (B) and the CF layers 113 (R) are formed at outermost areas within one pixel. However, the positional relationship is not limited to this, and the CF layer 113 (G) may be formed at an outermost area within one pixel.

(6) In the embodiments above, description has been provided that, as illustrated in FIG. 4B for instance, an end portion of a CF layer 113b (B) formed so as to cover a top surface of a BM 112 closer to an adjacent CF layer 113c (B) extends towards the adjacent CF layer 113c (B), and hence, the end portion of the CF layer 113b (B) has a greater length compared with the other end portion of the CF layer 113b (B), which is formed so as to cover a top surface of a BM 112 closer to an adjacent CF layer 113a (B). However, the present invention is not limited to this, and the present invention may have a structure as described in the following provided that the interval l2 is within the predetermined range of approximation described in the above. For instance, portions of two adjacent CF layers 113 formed so as to cover the top surface of the same BM 112 may extend towards each other.

Figure 14:
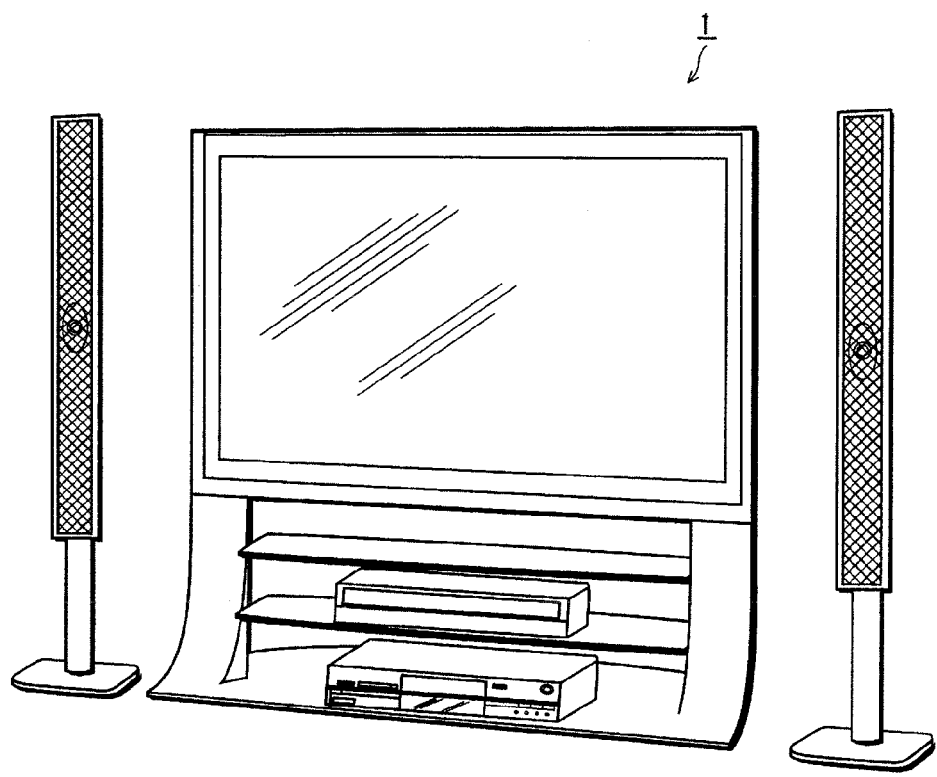
FIG. 14 is a perspective view illustrating an external appearance of the display apparatus 1.

(7) Although no indication has been made in the above of the exterior appearance of the display apparatus 1, the display apparatus 1 has, for instance, an exterior appearance as illustrated in FIG. 14.

Figure 15:
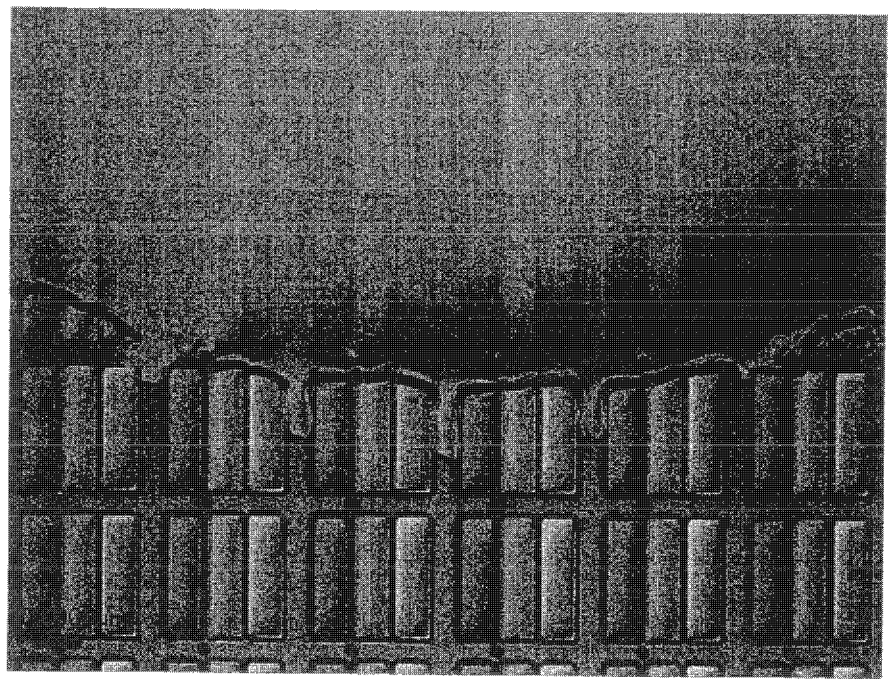
FIG. 15 is a photograph showing how resin spreads over the CF for comparison.

(8) FIG. 7A includes a schematic diagram illustrating how resin spreads in the CF for comparison when resin is dropped thereon. In addition to this, FIG. 15 is a photograph showing how resin spreads when resin is actually dropped on the CF for comparison. When viewing FIG. 15, it is similarly observed that the resin spreads starting from over the inter-pixel BMs rather than from over the CF layers.

(9) Combinations of the above-described embodiments and the modifications are construed as being included in the scope of the present invention.

INDUSTRIAL APPLICABILITY

The present invention is applicable as various display devices; TV devices; and portable electronic device displays, the uses of which include household, public, and professional use.

REFERENCE SIGNS LIST

| | |
|---|---|
| 1 | display apparatus |
| 10 | organic EL display panel |
| 20 | drive control unit |
| 21-24 | driving circuits |
| 25 | controlling circuit |
| 101 | TFT substrate |
| 102 | interlayer insulating film |
| 103a | anodes |
| 103b | auxiliary electrodes |
| 104 | bank |
| 105 | organic light-emitting layers |
| 106 | cathode |
| 107 | sealing layer |
| 111 | substrate |
| 112 | black matrices |
| 113 | CF layers |
| 121 | resin sealing layer |

The invention claimed is:

1. An EL display panel comprising:
an EL substrate having pixels arranged in a matrix, the pixels each including a first light-emitting unit that emits light, a second light-emitting unit that emits light, and a third light-emitting unit that emits light;
a color filter base facing a light-emitting side of the EL substrate;
color filter banks disposed on a surface of the color filter base facing the EL substrate, the color filter banks partitioning the surface of the color filter base into portions respectively corresponding to the pixels of the EL substrate and further partitioning each of the portions of the color filter base into a first area, a second area, and a third area that respectively correspond to the first light-emitting unit, the second light-emitting unit, and the third light-emitting unit;
a first color filter layer having a concave shape and defined by (i) top surfaces of a pair of color filter banks defining the first area, (ii) opposing lateral surfaces of the pair of color filter banks defining the first area, and (iii) the first area, the first color filter layer transmitting red light;
a second color filter layer having a concave shape and defined by (i) top surfaces of a pair of color filter banks defining the second area, (ii) opposing lateral surfaces of the pair of color filter banks defining the second area, and (iii) the second area, the second color filter layer transmitting green light;
a third color filter layer having a concave shape and defined by (i) top surfaces of a pair of color filter banks defining the third area, (ii) opposing lateral surfaces of the pair of color filter banks defining the third area, and (iii) the third area, the third color filter layer transmitting blue light; and
a resin layer filling space between each of the pixels of the EL substrate and the corresponding color filter layers formed in the corresponding portion of the color filter base, wherein
a common color filter bank between two portions of the color filter base corresponding to a first pixel and a second pixel that are adjacent to each other has a greater width than color filter banks between the first, second, and third areas in each of the portions of the color filter base,
a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel, and
the portion of the color filter layer formed with respect to the outermost area that covers the top surface of the color filter bank closest to the second pixel, among the pair of color filter banks defining the outermost area, and
the portion of the color filter layer formed with respect to the area adjacent to the first pixel that covers the top surface of the color filter bank closest to the first pixel, among the pair of color filter banks defining the area adjacent to the first pixel,
overlap each other above the common color filter bank.

2. The EL display panel of claim 1, wherein
the portion of the color filter layer formed with respect to the area adjacent to the first pixel that covers the top surface of the color filter bank closest to the first pixel, among the pair of color filter banks defining the area adjacent to the first pixel, extends towards the first pixel.

3. The EL display panel of claim 2, wherein
the portion of the color filter layer formed with respect to the outermost area that covers the top surface of the color filter bank closest to the second pixel, among the pair of color filter banks defining the outermost area, and
the portion of the color filter layer formed with respect to the area adjacent to the first pixel that covers the top surface of the color filter bank closest to the first pixel, among the pair of color filter banks defining the area adjacent to the first pixel,
overlap each other at a central region of a top surface of the common filter bank.

4. The EL display panel of claim 1, wherein
an auxiliary electrode is disposed between the first pixel and the second pixel of the EL substrate, and
the common color filter bank faces the auxiliary electrode.

5. The EL display panel of claim 1, wherein
the resin layer is composed of sealing resin.

6. The EL display panel of claim 1, wherein
portions of color filter layers formed with respect to the first, second, and third areas corresponding to the first pixel that cover top surfaces of color filter banks closest to a third pixel adjacent to the first pixel in a direction intersecting a direction along which the first and second pixels are adjacent (i) extend towards the third pixel and (ii) have greater lengths than portions of the color filter layers formed with respect to the first, second, and third areas corresponding to the first pixel that cover top surfaces of color filter banks opposing the color filter banks closest to the third pixel.

7. An EL display panel comprising:
an EL substrate having pixels arranged in a matrix, the pixels each including a first light-emitting unit that emits light, a second light-emitting unit that emits light, and a third light-emitting unit that emits light;
a color filter base facing a light-emitting side of the EL substrate;
a first color filter layer that transmits red light and that is formed with respect to a first area on a surface of the color filter base, the first area corresponding to the first light-emitting element;
a second color filter layer that transmits green light and that is formed with respect to a second area on the surface of the color filter base, the second area corresponding to the second light-emitting element and being located at a predetermined interval from the first color filter layer;
a third color filter layer that transmits blue light and that is formed with respect to a third area on the surface of the color filter base, the third area corresponding to the third light-emitting element and being located at an interval from the second color filter layer, the interval equaling or falling within a predetermined range of approximation to the predetermined interval; and
a resin layer filling space between each of the pixels of the EL substrate and the corresponding color filter layers formed in a corresponding one of portions of the surface of the color filter base, the portions of the surface of the color filter base respectively corresponding to the pixels of the EL substrate, wherein
a color filter layer formed with respect to an outermost area, among the first, second, and third areas corresponding to a first pixel, extends towards a second pixel that is adjacent to the first pixel, and
an end portion, closest to the second pixel, of the color filter layer formed with respect to the outermost area, among the first, second, and third areas corresponding to the first pixel, and
an end portion, closest to the first pixel, of a color filter layer formed with respect to an area adjacent to the first pixel, among the first, second, and third areas corresponding to the second pixel,
overlap each other in between the first pixel and the second pixel.

8. The EL display panel of claim 7, wherein
the color filter layer formed with respect to the area adjacent to the first pixel, among the first, second, and third areas corresponding to the second pixel, extends towards the first pixel.

9. The EL display panel of claim 8, wherein
the end portion, closest to the second pixel, of the color filter layer formed with respect to the outermost area, among the first, second, and third areas corresponding to the first pixel, and
the end portion, closest to the first pixel, of the color filter layer formed with respect to the area adjacent to the first pixel, among the first, second, and third areas corresponding to the second pixel,
overlap each other at a central region in between the first pixel and the second pixel.

10. The EL display panel of claim 7, wherein
an auxiliary electrode is disposed between the first pixel and the second pixel of the EL substrate.

11. The EL display panel of claim 7, wherein
the resin layer is composed of sealing resin.

12. The EL display panel of claim 7, wherein
color filter layers respectively formed with respect to the first, second, and third areas corresponding to the first pixel extend towards a third pixel adjacent to the first pixel in a direction intersecting a direction along which the first and second pixels are adjacent.

13. An EL display apparatus comprising:
the EL display panel of claim 1.

14. The EL display panel of claim 1, wherein
each of the first light-emitting unit, the second light-emitting unit, and the third light-emitting unit is an organic light emitter.

15. An organic EL display apparatus comprising:
the EL display panel of claim 14.

16. A manufacturing method for an EL display panel, the manufacturing method comprising:
a first step of preparing an EL substrate having pixels arranged in a matrix, the pixels each including a first light-emitting unit that emits light, a second light-emitting unit that emits light, and a third light-emitting unit that emits light;
a second step of preparing a color filter base;
a third step of forming color filter banks on a surface of the color filter base that is to face the EL substrate, the color filter banks partitioning the surface of the color filter base into portions respectively corresponding to the pixels of the EL substrate and further partitioning each of the portions of the color filter base into a first area, a second area, and a third area that respectively correspond to the first light-emitting unit, the second light-emitting unit, and the third light-emitting unit;
a fourth step of forming a first color filter layer having a concave shape and defined by (i) top surfaces of a pair of color filter banks defining the first area, (ii) opposing lateral surfaces of the pair of color filter banks defining the first area, and (iii) the first area, the first color filter layer transmitting red light;
a fifth step of forming a second color filter layer having a concave shape and defined by (i) top surfaces of a pair of color filter banks defining the second area, (ii) opposing lateral surfaces of the pair of color filter banks defining the second area, and (iii) the second area, the second color filter layer transmitting green light;
a sixth step of forming a third color filter layer having a concave shape and defined by (i) top surfaces of a pair of color filter banks defining the third area, (ii) opposing lateral surfaces of the pair of color filter banks defining the third area, and (iii) the third area, the third color filter layer transmitting blue light; and
a seventh step of filling space between each of the pixels of the EL substrate and the corresponding color filter layers formed in the corresponding portion of the color filter base with use of resin material, wherein
a common color filter bank between two portions of the color filter base corresponding to a first pixel and a second pixel that are adjacent to each other has a greater width than color filter banks between the first, second, and third areas in each of the portions of the color filter base, a portion of a color filter layer formed with respect to an outermost area adjacent to the second pixel, among the first, second, and third areas corresponding to the first pixel, that covers a top surface of a color filter bank closest to the second pixel, among a pair of color filter banks defining the outermost area, extends towards the second pixel and overlaps a portion of a color filter layer formed with respect to an area adjacent to the first pixel, among the first, second, and third areas corresponding to the second pixel, that covers a top surface of a color filter bank closest to the first pixel, among a pair of color filter banks defining the area adjacent to the first pixel, and the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, overlap each other above the common color filter bank.

17. The manufacturing method of claim 16, wherein the portion of the color filter layer formed with respect to the area adjacent to the first pixel that covers the top surface of the color filter bank closest to the first pixel, among the pair of color filter banks defining the area adjacent to the first pixel, extends towards the first pixel.

18. The manufacturing method of claim 17, wherein the portion of the color filter layer formed with respect to the outermost area that covers the top surface of the color filter bank closest to the second pixel, among the pair of color filter banks defining the outermost area, and the portion of the color filter layer formed with respect to the area adjacent to the first pixel that covers the top surface of the color filter bank closest to the first pixel, among the pair of color filter banks defining the area adjacent to the first pixel, overlap each other at a central region of a top surface of the common filter bank.

19. The manufacturing method of claim 16, wherein portions of color filter layers formed with respect to the first, second, and third areas corresponding to the first pixel that cover top surfaces of color filter banks closest to a third pixel adjacent to the first pixel in a direction intersecting a direction along which the first and second pixels are adjacent (i) extend towards the third pixel and (ii) have greater lengths than portions of the color filter layers formed with respect to the first, second, and third areas corresponding to the first pixel that cover top surfaces of color filter banks opposing the color filter banks closest to the third pixel.

20. A manufacturing method for an EL display panel, the manufacturing method comprising:

a first step of preparing an EL substrate having pixels arranged in a matrix, the pixels each including a first light-emitting unit that emits light, a second light-emitting unit that emits light, and a third light-emitting unit that emits light;

a second step of preparing a color filter base;

a third step of forming a first color filter layer that transmits red light with respect to a first area on a surface of the color filter base, the first area corresponding to the first light-emitting element;

a fourth step of forming a second color filter layer that transmits green light with respect to a second area on the surface of the color filter base, the second area corresponding to the second light-emitting element and being located at a predetermined interval from the first color filter layer;

a fifth step of forming a third color filter layer that transmits blue light with respect to a third area on the surface of the color filter base, the third area corresponding to the third light-emitting element and being located at an interval from the second color filter layer, the interval equaling or falling within a predetermined range of approximation to the predetermined interval; and a sixth step of filling space between each of the pixels of the EL substrate and the corresponding color filter layers formed in a corresponding one of portions of the surface of the color filter base with use of resin material, the portions of the surface of the color filter base respectively corresponding to the pixels of the EL substrate, wherein a color filter layer formed with respect to an outermost area, among the first, second, and third areas corresponding to a first pixel, extends towards a second pixel that is adjacent to the first pixel, and an end portion, closest to the second pixel, of the color filter layer formed with respect to the outermost area, among the first, second, and third areas corresponding to the first pixel, and an end portion, closest to the first pixel, of a color filter layer formed with respect to an area adjacent to the first pixel, among the first, second, and third areas corresponding to the second pixel, overlap each other in between the first pixel and the second pixel.

21. The manufacturing method of claim 20, wherein the color filter layer formed with respect to the area that is adjacent to the first pixel, among the first, second, and third areas corresponding to the second pixel, extends towards the first pixel.

22. The manufacturing method of claim 21, wherein the end portion, closest to the second pixel, of the color filter layer formed with respect to the outermost area, among the first, second, and third areas corresponding to the first pixel, and the end portion, closest to the first pixel, of the color filter layer formed with respect to the area adjacent to the first pixel, among the first, second, and third areas corresponding to the second pixel, overlap each other at a central region in between the first pixel and the second pixel.

23. The manufacturing method of claim 20, wherein color filter layers respectively formed with respect to the first, second, and third areas corresponding to the first pixel extend towards a third pixel adjacent to the first pixel in a direction intersecting a direction along which the first and second pixels are adjacent.

* * * * *